(12) United States Patent  
Ghosh et al.

(10) Patent No.: US 7,664,350 B2  
(45) Date of Patent: Feb. 16, 2010

(54) COMPACT OPTICS FOR CONCENTRATION, AGGREGATION AND ILLUMINATION OF LIGHT ENERGY

(75) Inventors: Shondip Ghosh, Berkeley, CA (US); David Sheldon Schultz, San Francisco, CA (US)

(73) Assignee: Banyan Energy, Inc., Kensington, CA (US)

( * ) Notice: Subject to any disclaimer, the term of this patent is extended or adjusted under 35 U.S.C. 154(b) by 0 days.

(21) Appl. No.: 12/207,346

(22) Filed: Sep. 9, 2008

(65) Prior Publication Data

US 2009/0067784 A1    Mar. 12, 2009

Related U.S. Application Data

(63) Continuation-in-part of application No. 11/852,854, filed on Sep. 10, 2007.

(51) Int. Cl.
```
G02B 6/26      (2006.01)
H01L 31/00     (2006.01)
F24J 2/10      (2006.01)
```
(52) U.S. Cl. .............. 385/31; 385/33; 385/146; 385/900; 136/259; 126/684; 126/685

(58) Field of Classification Search ............ 385/900, 385/901, 146, 134, 100, 36, 31, 33; 136/259; 126/634, 684, 685
See application file for complete search history.

(56) References Cited

U.S. PATENT DOCUMENTS 705,778 A    7/1902   McCabe
3,780,722 A * 12/1973  Swet .................... 126/680
4,029,519 A *  6/1977  Schertz et al. ........ 136/246
4,357,486 A   11/1982  Blieden et al.
4,379,944 A *  4/1983  Borden et al. ........ 136/259
4,411,490 A * 10/1983  Daniel .................. 126/648
4,505,264 A    3/1985  Tremblay
4,863,224 A    9/1989  Afian et al.
5,050,946 A    9/1991  Hathaway et al.
5,146,354 A    9/1992  Plesinger
5,150,960 A    9/1992  Redick
5,237,641 A    8/1993  Jacobson et al.
5,253,089 A   10/1993  Imai
5,303,322 A    4/1994  Winston et al.

(Continued)

FOREIGN PATENT DOCUMENTS

JP      2001-127331 A    5/2001
JP      2003-234484 A    8/2003
WO      WO 2006/085339 A2  8/2006

OTHER PUBLICATIONS

Ghosh et al., "A New Approach to Concentrating and Aggregating Light Energy", Jun. 2007.
Chaves et al., "Ultra Flat Ideal Concentrators of High Concentration", Solar Energy, 2000, pp. 269-281, vol. 69, No. 4, Elsevier Science Ltd., Great Britain.

(Continued)

Primary Examiner—Brian M Healy
(74) Attorney, Agent, or Firm—Foley & Lardner LLP

(57) ABSTRACT

A solar concentrator having a concentrator element for collecting input light, a redirecting component with a plurality of incremental steps for receiving the light and also for redirecting the light, and a waveguide including a plurality of incremental portions enabling collection and concentration of the light onto a receiver. Other systems replace the receiver by a light source so system optics can provide illumination.

11 Claims, 24 Drawing Sheets

U.S. PATENT DOCUMENTS

| | | |
|---|---|---|
| 5,323,477 A | 6/1994 | Lebby et al. |
| 5,339,179 A | 8/1994 | Rudisill et al. |
| 5,341,231 A | 8/1994 | Yamamoto et al. |
| 5,353,075 A | 10/1994 | Conner et al. |
| 5,359,691 A | 10/1994 | Tai et al. |
| 5,386,090 A | 1/1995 | Hofmann |
| 5,390,085 A | 2/1995 | Mari-Roca et al. |
| 5,390,276 A | 2/1995 | Tai et al. |
| 5,392,199 A | 2/1995 | Kashima et al. |
| 5,396,350 A | 3/1995 | Beeson et al. |
| 5,400,224 A | 3/1995 | DuNah et al. |
| 5,408,388 A | 4/1995 | Kobayashi et al. |
| 5,410,454 A | 4/1995 | Murase et al. |
| 5,418,384 A | 5/1995 | Yamana et al. |
| 5,420,761 A | 5/1995 | DuNah et al. |
| 5,428,468 A | 6/1995 | Zimmerman et al. |
| 5,432,876 A | 7/1995 | Appeldorn et al. |
| 5,438,484 A | 8/1995 | Kanda et al. |
| 5,440,197 A | 8/1995 | Gleckman |
| 5,455,882 A | 10/1995 | Veligdan |
| 5,467,417 A | 11/1995 | Nakamura et al. |
| 5,477,239 A | 12/1995 | Busch et al. |
| 5,479,275 A | 12/1995 | Abileah |
| 5,485,291 A | 1/1996 | Qiao et al. |
| 5,485,354 A | 1/1996 | Ciupke et al. |
| 5,499,165 A | 3/1996 | Holmes, Jr. |
| 5,506,929 A | 4/1996 | Tai et al. |
| 5,521,725 A | 5/1996 | Beeson et al. |
| 5,528,709 A | 6/1996 | Koike et al. |
| 5,528,720 A | 6/1996 | Winston et al. |
| 5,542,017 A | 7/1996 | Koike |
| 5,555,329 A | 9/1996 | Kuper et al. |
| 5,579,134 A | 11/1996 | Lengyel |
| 5,580,932 A | 12/1996 | Koike |
| 5,581,683 A | 12/1996 | Bertignoll et al. |
| 5,594,830 A | 1/1997 | Winston et al. |
| 5,598,281 A | 1/1997 | Zimmerman et al. |
| 5,608,837 A | 3/1997 | Tai et al. |
| 5,621,833 A | 4/1997 | Lau et al. |
| 5,627,926 A | 5/1997 | Nakamura et al. |
| 5,631,994 A | 5/1997 | Appeldorn et al. |
| 5,640,483 A | 6/1997 | Lin |
| 5,647,655 A | 7/1997 | Kashima et al. |
| 5,648,858 A | 7/1997 | Shibata et al. |
| 5,659,643 A | 8/1997 | Appeldorn et al. |
| 5,664,862 A | 9/1997 | Redmond et al. |
| 5,664,873 A | 9/1997 | Kanda et al. |
| 5,667,762 A | 9/1997 | Fukushima et al. |
| 5,668,913 A | 9/1997 | Tai et al. |
| 5,671,994 A | 9/1997 | Tai et al. |
| 5,673,128 A | 9/1997 | Ohta et al. |
| 5,684,354 A | 11/1997 | Gleckman |
| 5,692,066 A | 11/1997 | Lee et al. |
| 5,704,703 A | 1/1998 | Yamada et al. |
| 5,710,793 A | 1/1998 | Greenberg |
| 5,828,427 A | 10/1998 | Faris |
| 5,835,661 A | 11/1998 | Tai et al. |
| 5,838,403 A | 11/1998 | Jannson et al. |
| 5,854,872 A | 12/1998 | Tai |
| 5,870,156 A | 2/1999 | Heembrock |
| 5,877,874 A | 3/1999 | Rosenberg |
| 5,892,325 A | 4/1999 | Gleckman |
| 5,905,583 A | 5/1999 | Kawai et al. |
| 5,905,826 A | 5/1999 | Benson, Jr. et al. |
| 5,914,760 A | 6/1999 | Daiku |
| 5,926,601 A | 7/1999 | Tai et al. |
| 5,977,478 A * | 11/1999 | Hibino et al. ............... 136/259 |
| 5,982,540 A | 11/1999 | Koike et al. |
| 5,993,020 A | 11/1999 | Koike |
| 6,002,829 A | 12/1999 | Winston et al. |
| 6,005,343 A | 12/1999 | Rakhimov et al. |
| 6,007,209 A | 12/1999 | Pelka |
| 6,021,007 A | 2/2000 | Murtha |
| 6,043,591 A | 3/2000 | Gleckman |
| 6,072,551 A | 6/2000 | Jannson et al. |
| 6,104,447 A | 8/2000 | Faris |
| 6,108,059 A | 8/2000 | Yang |
| 6,111,622 A | 8/2000 | Abileah |
| 6,123,431 A | 9/2000 | Teragaki et al. |
| 6,129,439 A | 10/2000 | Hou et al. |
| 6,134,092 A | 10/2000 | Pelka et al. |
| 6,151,089 A | 11/2000 | Yang et al. |
| 6,164,799 A | 12/2000 | Hirmer et al. |
| 6,172,809 B1 | 1/2001 | Koike et al. |
| 6,222,598 B1 | 4/2001 | Hiyama et al. |
| 6,234,656 B1 | 5/2001 | Hosseini et al. |
| 6,252,155 B1 | 6/2001 | Ortabasi |
| 6,266,108 B1 | 7/2001 | Bao et al. |
| 6,313,892 B2 | 11/2001 | Gleckman |
| 6,335,999 B1 | 1/2002 | Winston et al. |
| 6,347,874 B1 | 2/2002 | Boyd et al. |
| 6,351,594 B1 | 2/2002 | Nakamura et al. |
| 6,379,016 B1 | 4/2002 | Boyd et al. |
| 6,409,356 B1 | 6/2002 | Nishimura |
| 6,428,198 B1 | 8/2002 | Saccomanno et al. |
| 6,440,769 B2 | 8/2002 | Peumans et al. |
| 6,473,554 B1 | 10/2002 | Pelka et al. |
| 6,476,312 B1 | 11/2002 | Barnham |
| 6,496,237 B1 | 12/2002 | Gleckman |
| 6,497,939 B1 | 12/2002 | Obuchi et al. |
| 6,512,600 B1 | 1/2003 | Kawai et al. |
| 6,576,887 B2 | 6/2003 | Whitney et al. |
| 6,592,234 B2 | 7/2003 | Epstein et al. |
| 6,612,709 B2 | 9/2003 | Yamada et al. |
| 6,623,132 B2 | 9/2003 | Lekson et al. |
| 6,639,349 B1 | 10/2003 | Bahadur |
| 6,644,823 B2 | 11/2003 | Egawa et al. |
| 6,647,199 B1 | 11/2003 | Pelka et al. |
| 6,671,452 B2 | 12/2003 | Winston et al. |
| 6,738,051 B2 | 5/2004 | Boyd et al. |
| 6,752,504 B2 | 6/2004 | Lee et al. |
| 6,755,545 B2 | 6/2004 | Lee |
| 6,796,700 B2 | 9/2004 | Kraft |
| 6,828,007 B2 | 12/2004 | Obuchi et al. |
| 6,842,571 B2 | 1/2005 | Kramer et al. |
| 6,851,815 B2 | 2/2005 | Lee |
| 6,879,354 B1 | 4/2005 | Sawayama et al. |
| 6,948,838 B2 | 9/2005 | Kunstler |
| 6,957,904 B2 | 10/2005 | Randall |
| 6,966,661 B2 | 11/2005 | Read |
| 6,966,684 B2 | 11/2005 | Sommers et al. |
| 6,976,778 B2 | 12/2005 | Kamijima |
| 6,976,779 B2 | 12/2005 | Ohtsuki et al. |
| 6,986,660 B2 | 1/2006 | Kumar et al. |
| 6,992,733 B1 | 1/2006 | Klein |
| 6,993,242 B2 | 1/2006 | Winston et al. |
| 7,018,085 B2 | 3/2006 | Lee et al. |
| 7,046,907 B2 | 5/2006 | Miyashita |
| 7,063,449 B2 | 6/2006 | Ward |
| 7,286,296 B2 * | 10/2007 | Chaves et al. ............... 359/641 |
| 2008/0271776 A1 * | 11/2008 | Morgan ..................... 136/246 |
| 2009/0067784 A1 * | 3/2009 | Ghosh et al. ................. 385/33 |

OTHER PUBLICATIONS

Chaves et al., "Ideal Concentrators with Gaps", *Applied Optics*, Mar. 1, 2002, pp. 1267-1276, vol. 41, No, 7, *Optical Society of America*, USA.

U.S. Appl. No. 60/915,207, filed May 1, 2007, Morgan.

U.S. Appl. No. 60/942,745, filed Jun. 8, 2007, Morgan.

* cited by examiner

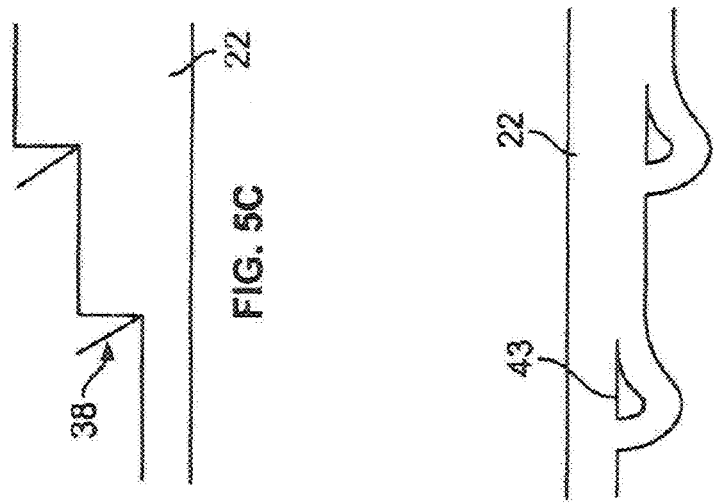
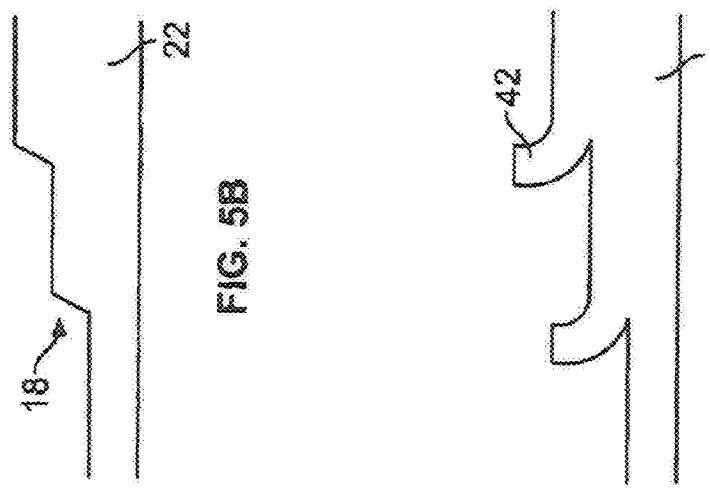
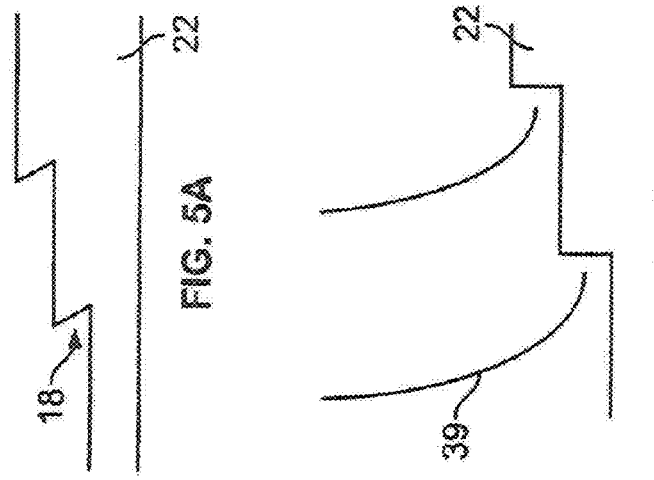

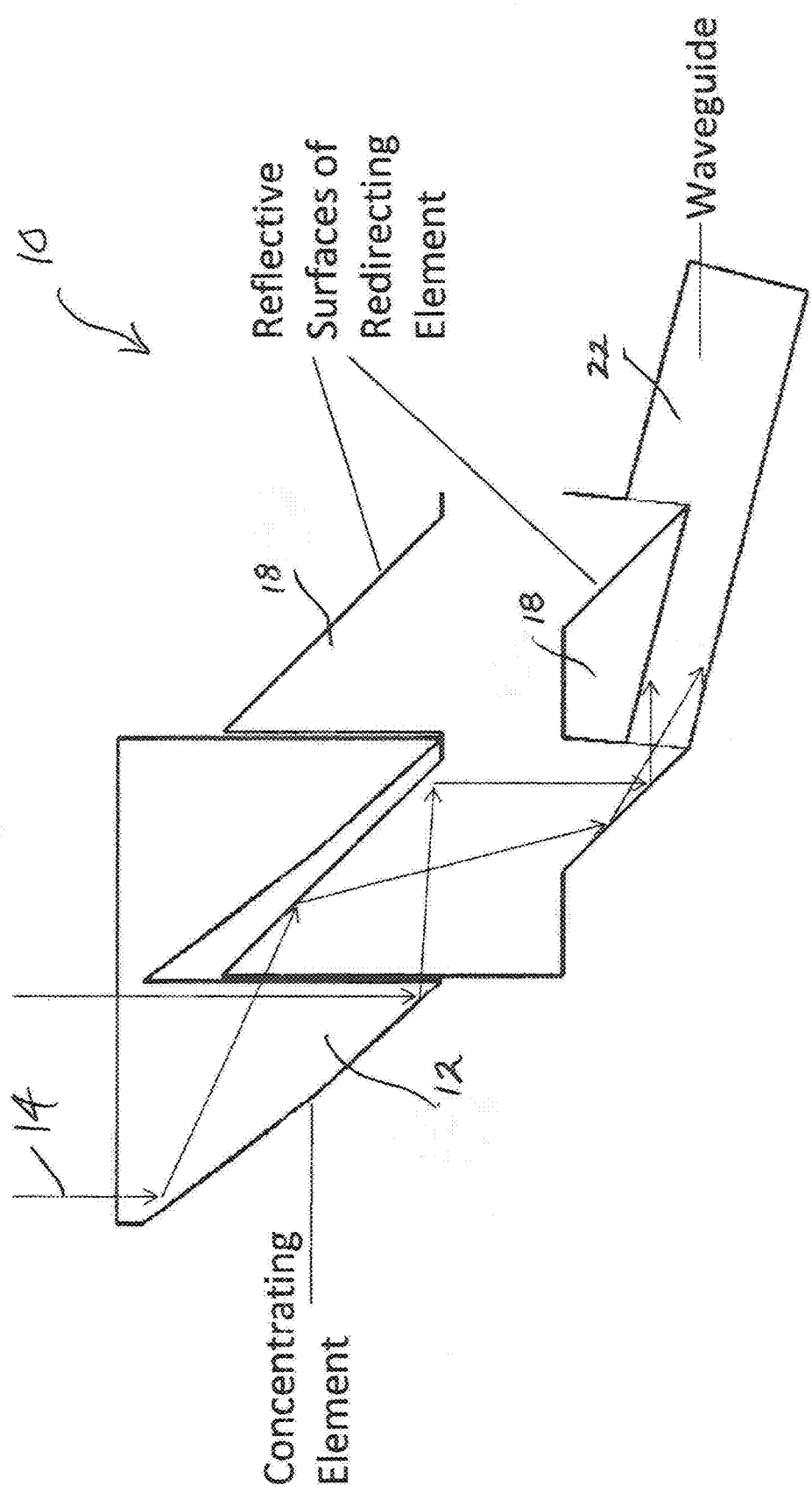

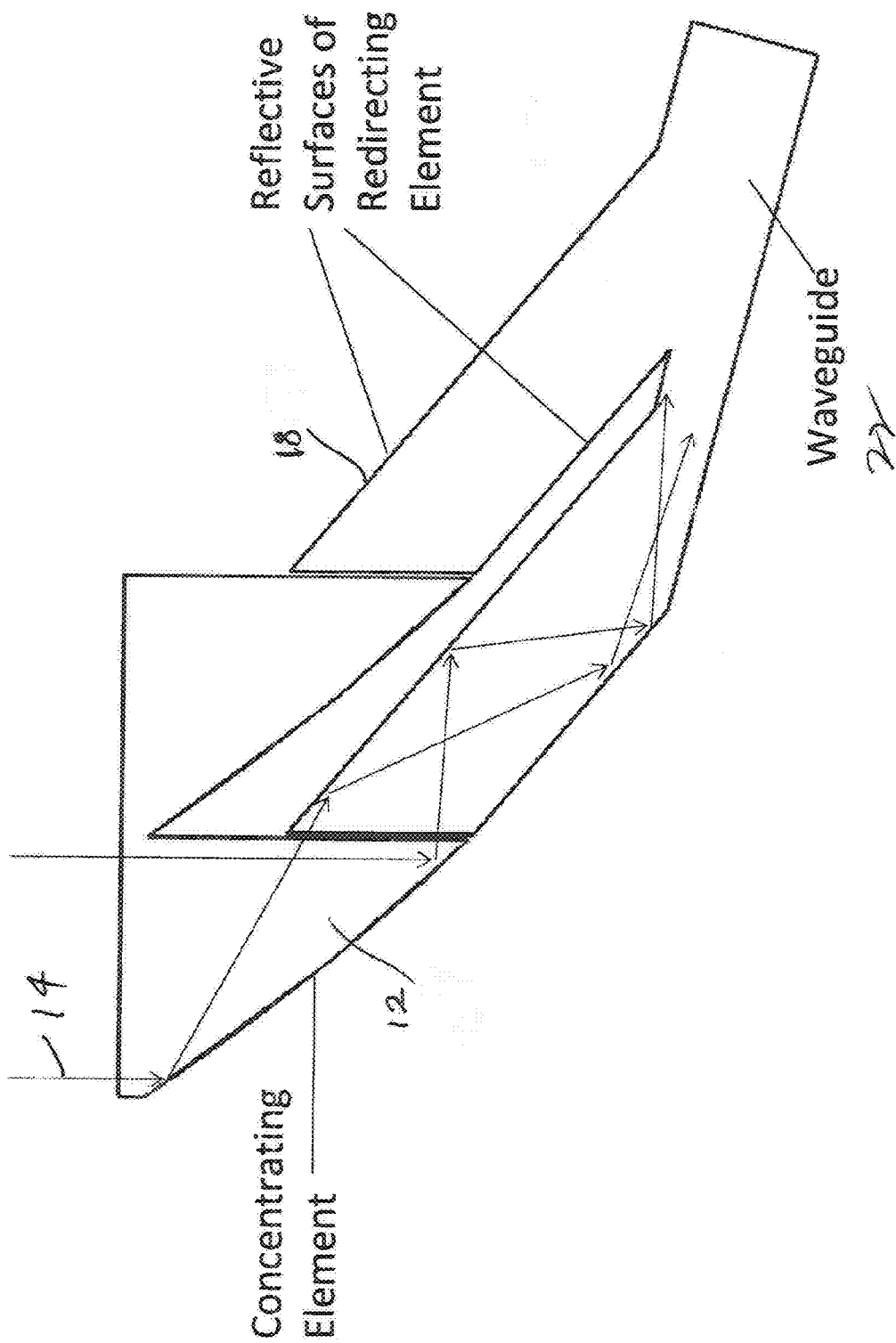

US 7,664,350 B2

COMPACT OPTICS FOR CONCENTRATION, AGGREGATION AND ILLUMINATION OF LIGHT ENERGY

CROSS-REFERENCE TO RELATED PATENT APPLICATIONS

This application is a continuation-in-part and claims priority from co-pending U.S. patent application Ser. No. 11/852,854, filed Sep. 10, 2007, incorporated herein by reference in its entirety.

This invention is directed to a solar concentrator for producing electrical, thermal and radiative energy. More particularly, the invention is directed to a solar concentrator using a combination of refractive and reflective and/or redirecting optics to concentrate and aggregate sunlight from a plurality of concentrator systems. Other applications include lighting and illumination using the compact optics.

BACKGROUND OF THE INVENTION

Solar collectors have long been developed for the collection and concentration of sunlight. Increasing the energy density of ambient sunlight enables more efficient conversion to useful forms of energy. Numerous geometries and systems have been developed, but the mediocre performance and high costs of such systems do not permit widespread use. In order to achieve adequate performance and manufacturability, improvements in solar energy collectors are needed.

SUMMARY OF THE INVENTION

A concentrator system includes a combination of optical elements comprising a concentrating element, such as a refractive and/or reflective component, a reflective and/or refractive element to redirect sunlight into a light waveguide which is constructed with a plurality of stepped reflective surfaces for efficient aggregation and concentration into a receiver unit (thermal and/or photovoltaic) and other conventional energy conversion systems. The control of the geometry of the reflective surfaces along with the aspect ratio of the light waveguide enables ready manipulation, collection and concentration of sunlight preferably onto a contiguous area for a variety of commercial applications, including solar cell devices, light pipe applications, heat exchangers, fuel production systems, spectrum splitters and other secondary manipulation of the light for various optical applications.

These and other objects, advantages and applications of the invention, together with the organization and manner of operation thereof, will become apparent from the following detailed description when taken in conjunction with the accompanying drawings.

BRIEF DESCRIPTION OF THE DRAWINGS

FIG. 5A shows a first edge shape of a reflecting element of a waveguide; FIG. 5B shows a second edge shape for a reflecting element of a waveguide; FIG. 5C shows a first separate element for redirecting light as part of a stepped waveguide; FIG. 5D shows a second separate element for redirecting light as part of a stepped waveguide; FIG. 5E shows a system with plural light pipes coupled to a stepped waveguide and FIG. 5F shows a waveguide with embedded redirecting components;

FIG. 26 illustrates yet another embodiment of a solar concentrator of the invention;

FIG. 27 illustrates a further embodiment of a solar concentrator of the invention.

DETAILED DESCRIPTION OF THE PREFERRED EMBODIMENTS

Figure 1:
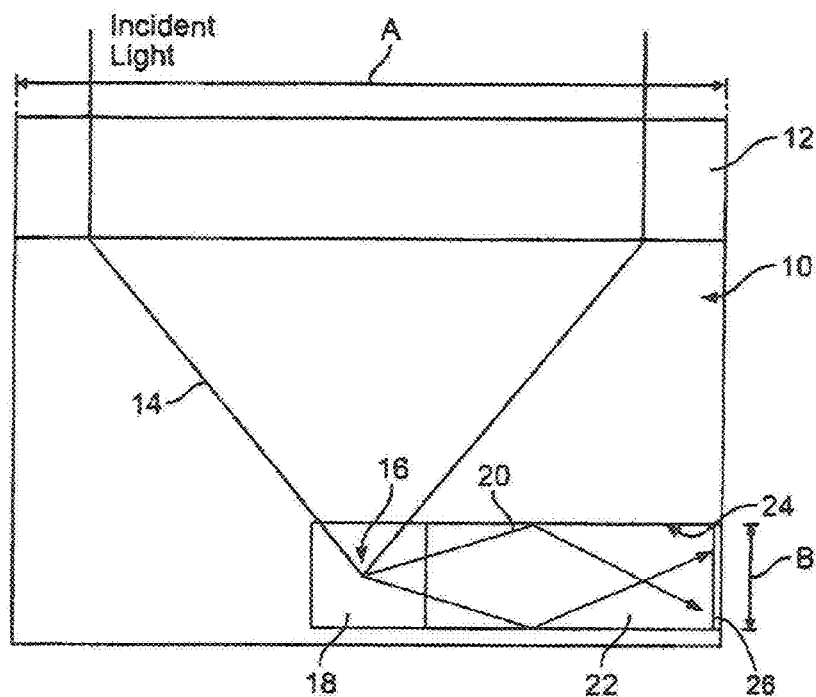
FIG. 1 illustrates a solar energy concentrator generally constructed in accordance with an embodiment of the invention.

A solar energy concentrator system constructed in accordance with a preferred embodiment of the invention is indicated schematically at 10 in FIG. 1. The solar energy concentrator system 10, includes an optical concentrating element 12 which can be any conventional optical concentrator, such as an objective lens, a Fresnel lens, and/or a reflective surface element, such as a parabolic or compound shaped reflector. This optical concentrating element 12 acts on input light 14 to concentrate the light 14 to a small focal area 16. In the preferred embodiment, the small focal area 16 is disposed within reflective or redirecting component 18, or other conventional optical redirecting element which causes total internal reflection. The redirecting component 18 redirects the concentrated light 20 into a waveguide 22. The waveguide 22 is constructed to cause internal reflection of the light 20 which propagates along the waveguide 22 in accordance with Snell's law wherein total internal reflection occurs when the angle of the light 20 incident on surface 24 of the waveguide 22 is greater than the critical angle, $\emptyset_c$:

$$\emptyset_c = \sin(\eta_{waveguide}/\eta_{cladding})$$

Where $\emptyset_c$=critical angle for total internal reflection,
$\eta_{waveguide}$=refractive index of waveguide material
$\eta_{cladding}$=refractive index of a cladding layer or the index at the ambient/waveguide interface.

A receiver 26 is disposed at the end of the waveguide 22 and receives the light 20 for processing into useful energy or other optical applications.

Figure 13:
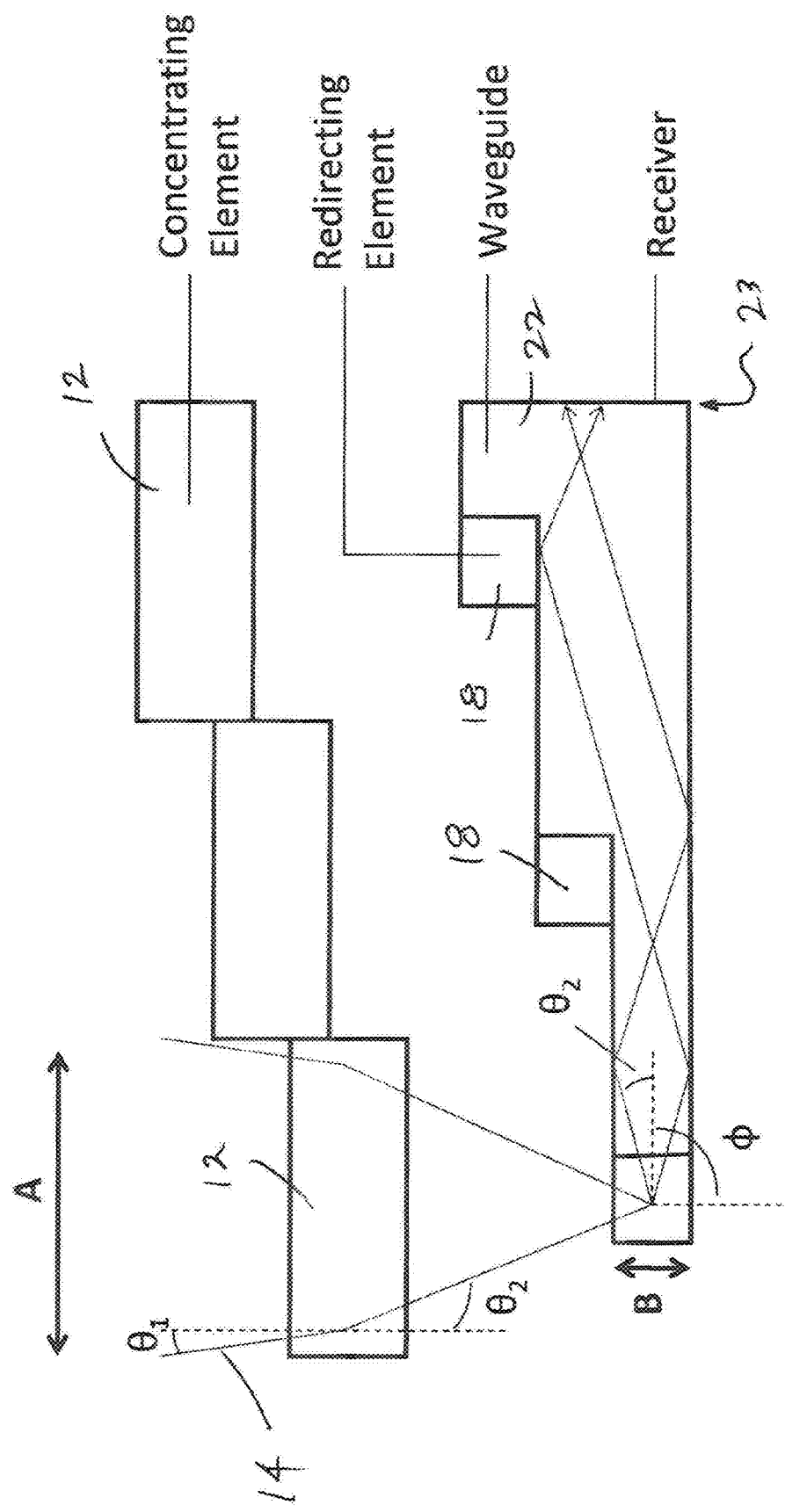
FIG. 13 illustrates another representation of an embodiment of a solar energy concentrator or an illuminator.

FIG. 13 illustrates a preferred form of the system 10 with details of this mechanism. A plurality N of concentrating elements 12 and redirecting elements 18 are shown. Each of the concentrating elements 12 takes the input light 14 with a half angle of $\theta_1$ from an area A, and concentrates the light 14 to a smaller area B with half angle $\theta_2$, such that Concentration Ratio=A/B. Each of the redirecting elements 18 receives the concentrated light from an associated one of the concentrating elements 12, rotates it by some angle $\phi$, and inserts it into a section of the waveguide 22, preserving the level of concentration defined by area B and half angle $\theta_2$. The waveguide 22 is a plurality of sections having incremental steps of height B that are spaced from each other by length A. Each section of the waveguide 22 receives light from an associated one of the redirecting elements 18, such that the waveguide 22 as a whole aggregates light from the plurality of the concentrating elements 14 and the redirecting elements 18, and propagates the light 14 along its length for collection by a receiver 23. The waveguide 22 does not change the level of concentration delivered to it, and therefore the aspect ratio of the waveguide 22

= height of waveguide/length of waveguide

= $N \times B / N \times A$

= $B/A$

= 1/Concentration Ratio in each element

Compactness has great practical benefits for solar concentrators (and other devices such as illuminators). Among other benefits: less material is used, large air gaps between optics and the receiver 23 that need difficult sealing are eliminated, devices are much less bulky for cheaper shipping and installation, traditional flat module manufacturing methods can be utilized as opposed to expensive and risky custom manufacturing methods.

The limit of compactness for the waveguide 22 is defined by the receiver 23. Thus, the waveguide 22 can only be as compact as the receiver 23 to which it delivers light. For most concentrators, the compactness of the concentrator 12 is significantly larger than the width of the receiver 23. However, since this device constructs the waveguide 22 from sections each having height defined by the area of concentrated light delivered to it, the aggregated waveguide 22 has a height equal to the width of the receiver 23. In other words, the waveguide 22 is at the limit of compactness.

Therefore in view of the construction of the invention, the concentration of light achieved by the concentrator system 10 being a function of the aspect ratio A/B leads to a highly compact concentrator system 10. The device can aggregate light from a relatively wide area and concentrate it to a relatively small receiver that has a contiguous area while remaining highly compact. This simplifies production by reducing the volume of material required, allowing for multiple units to be made from a single mold and reducing assembly complexity.

Figure 11A:
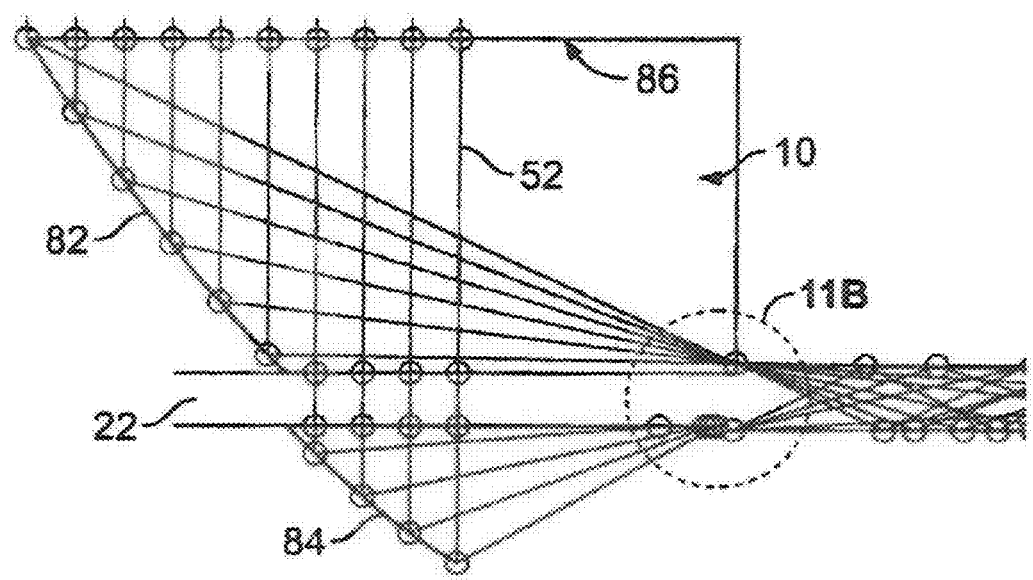
FIG. 11A shows a further closed element coupled to a waveguide and FIG. 11B shows an enlarged view of portion of FIG. 11A at a juncture of the optical element and the waveguide.
Figure 11B:
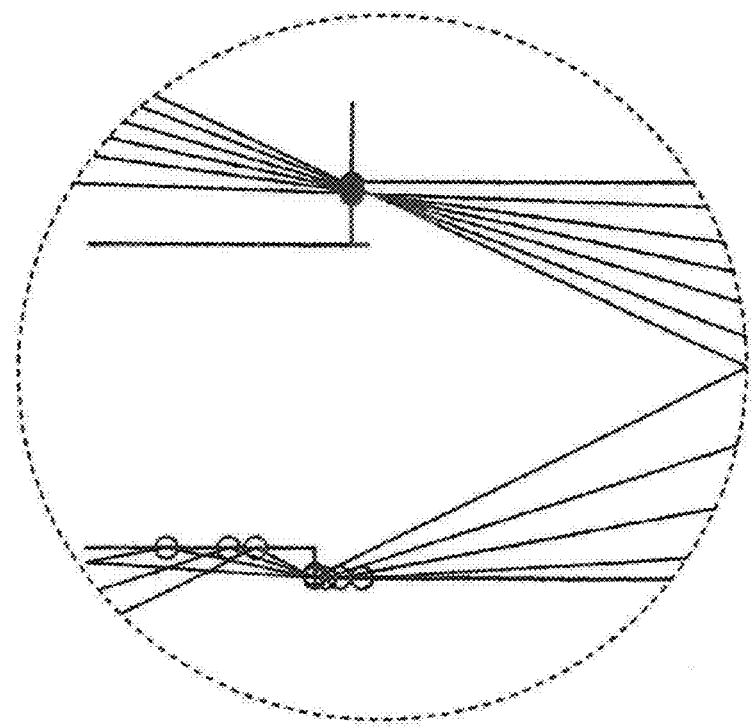
Figure 12:
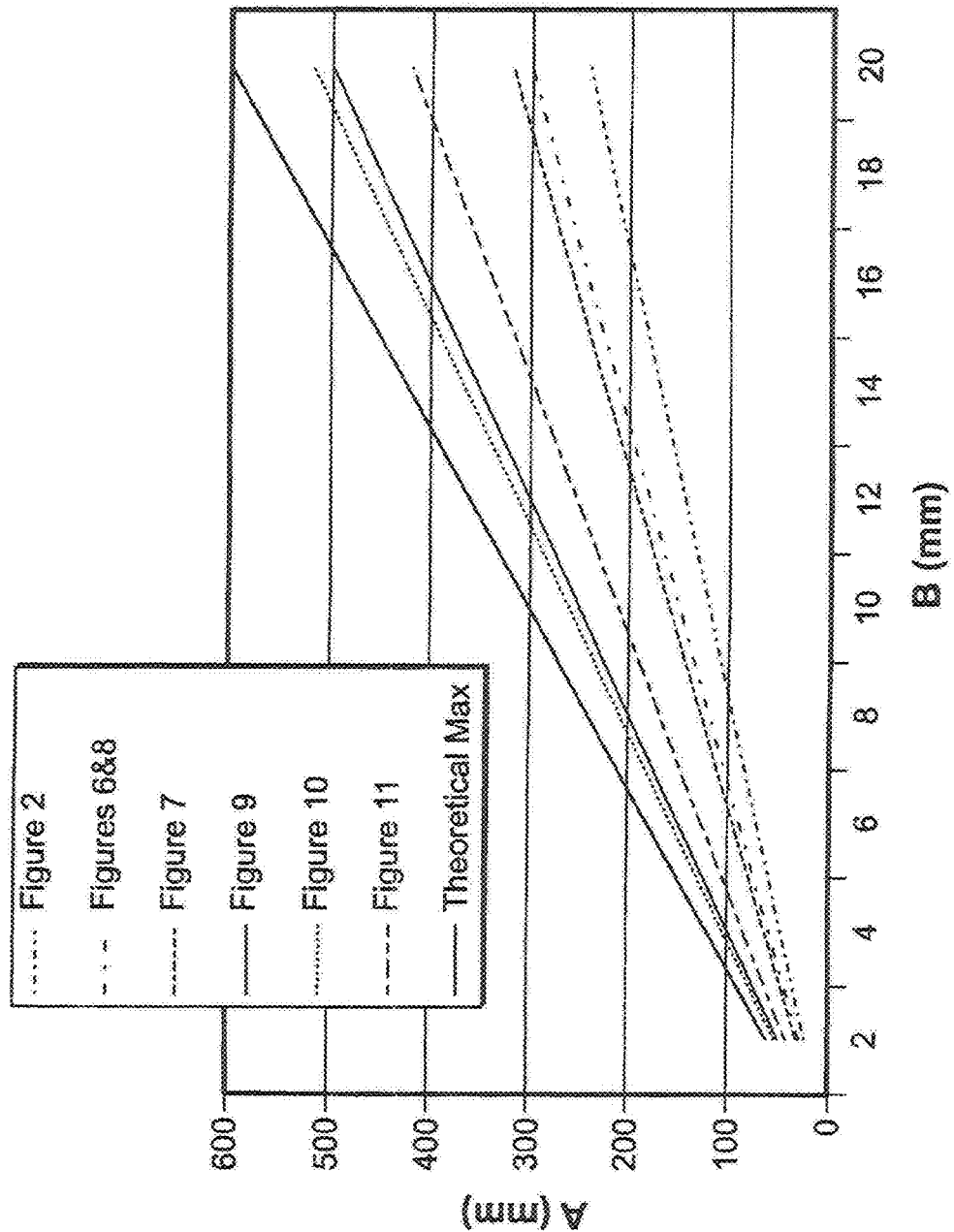
FIG. 12 shows ray tracing results for the optical systems of FIGS. 2 and 6-11.

FIG. 12 shows the results of ray tracings performed on the designs depicted in FIGS. 2 and 6-11. Each design demonstrates a particular performance in terms of its ability to concentrate light in the linear dimension, as shown by the ratio of A/B. The data is for light having an input cone half angle of +−1 degree, an output cone half angle of +−20 degrees, an initial refractive index of n=1, and a final refractive index of n=1.5. The theoretical maximum allowable concentration of light with those input parameters is 30× in the linear dimension, whereas FIG. 9 for example achieves a concentration factor of 25×. Since the concentration factor in the linear dimension is proportional to the aspect ratio A/B, the design shown in FIG. 9 can deliver a concentrator that is 250 millimeters long (A) while only 10 millimeters in thickness (B); or a concentrator that is 500 millimeters long (A) while only 20 millimeters in thickness (B). This represents a highly compact concentrator system 10 that can effectively aggregate concentrated light from a relatively wide area and deliver it to a single receiver.

The dimensions and number of the concentrating elements 12 and redirecting elements 18 can be varied for any entry aperture of the concentrator 12. For example, the system 10 shown in FIG. 13 can be achieved with twice as many elements (2×N) of half the size (A/2 and B/2). As the concentrating elements 12 and the redirecting elements 18 become smaller and more numerous, the aspect ratio of the entire concentrator 12 approaches the aspect ratio of the waveguide 22, given by 1/Concentration Ratio. In other words, for a Concentration Ratio of 10, the aspect ratio of the concentrator 12 can be 0.1.

Figure 14:
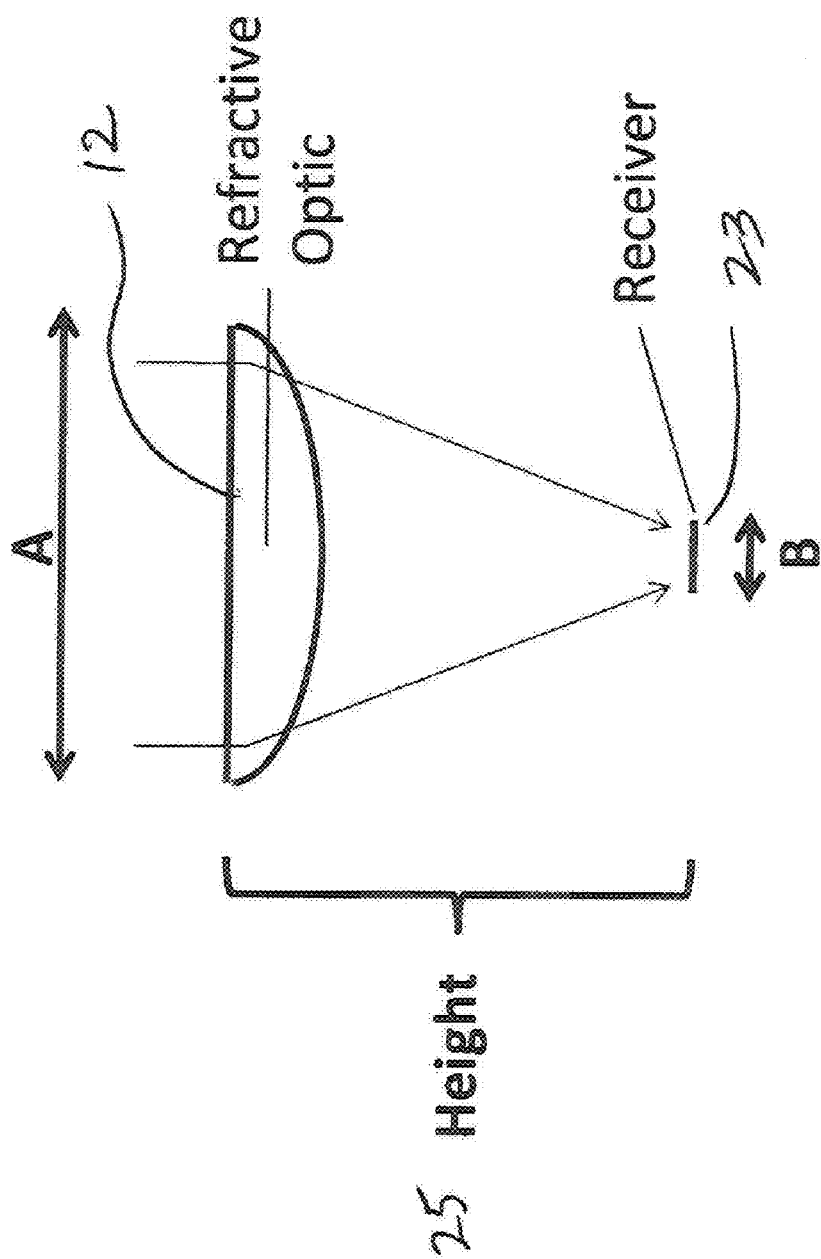
FIG. 14 illustrates a refractive concentrator component for a conventional system.
Figure 15:
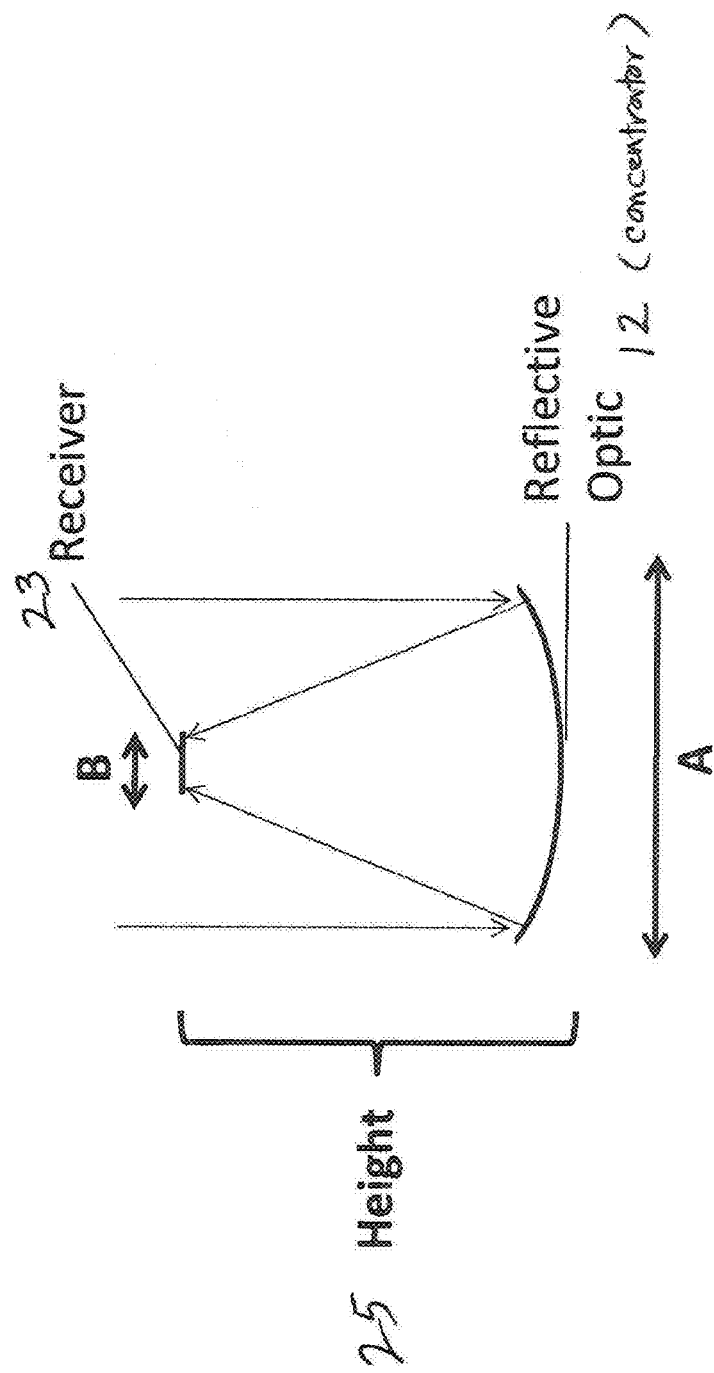
FIG. 15 illustrates a reflective concentrator component for another conventional system.

Typical aspect ratios for concentrators 12 are on the order of 1. FIG. 14 shows a refractive concentrator 12, which may be, for example, an objective lens or a Fresnel lens. The focal length of an objective lens defines the height 25. The Concentration Ratio is given by A/B, whereas the aspect ratio is given by height/A, which is larger than the Concentration Ratio. FIG. 15 shows a similar situation for a reflective form of the concentrator 12.

Figure 16:
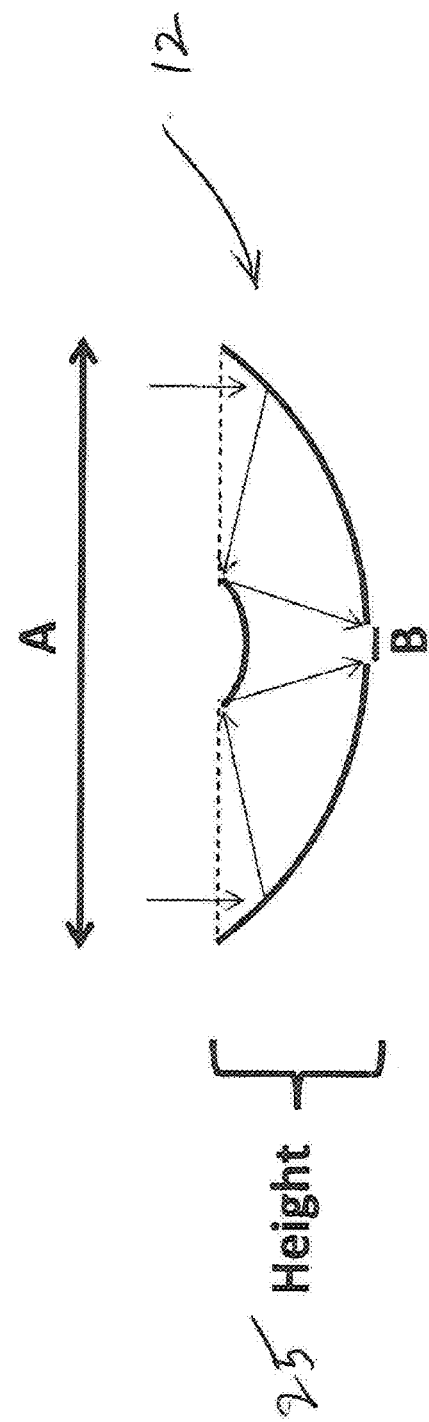
FIG. 16 illustrates a Cassegrainian concentrator having a primary and secondary reflective optic.

Attempts have been made to reach the limit of compactness for a single concentrating element. FIG. 16 shows a Cassegrainian concentrator composed of a primary and secondary reflective optic. The aspect ratio given by Height/A is 0.25. Winston, in "Planar Concentrators Near the Etendue Limit", 2005, describes the "fundamental compactness limit of a ¼aspect ratio." In the context of the invention, this compactness limit applies to an individual one of the concentrating elements 12. The use of the waveguide 22 that aggregates light from multiple ones of the concentrating elements 12 is what allows the compactness of the system 10 to go lower than ¼ and approach 1/Concentration Ratio.

The invention also has advantages in the transmission efficiency of light energy from input to delivery to the receiver 23. In FIG. 13, $\theta_2$ is controlled by the concentrating element 12. $\theta_2$ also becomes the angle made by the light hitting the surface of the waveguide 22, and 90-$\theta_2$ is the angle made with respect to the normal of the waveguide surface. As discussed above, $\theta_2$ can be set to achieve total internal reflection within the waveguide 22, reducing surface absorption losses to zero.

In addition, the concentrating element 12 and redirecting element 18 can be designed to manipulate the light 14 using total internal reflection, as shown in specific embodiments below. Also, the concentrating element 12 and redirecting element 18 and the waveguide 22 can be designed to provide a contiguous path within a solid dielectric medium for the light 14. In other words, light rays from the input region to the receiver 23 need never encounter either a reflective coating or a change in refractive index. Reflective coatings can cause absorption losses of ~8%. A change in refractive index from an optical material of refractive index 1.5 (plastic or glass) to air can cause Fresnel reflection losses of ~4%. Transmission efficiency with respect to these loss mechanisms can therefore approach 100%.

This is in contrast to conventional concentrator optics. Reflective optics will have 8% loss per reflection. Transmission efficiency will therefore be ~92% for a single optic, and ~85% when a secondary reflective optic is used. Refractive optics require at least one change in refractive index. Transmission efficiency will therefore be ~96% for a single optic, and ~92% when a secondary refractive optic is used.

Figure 17:
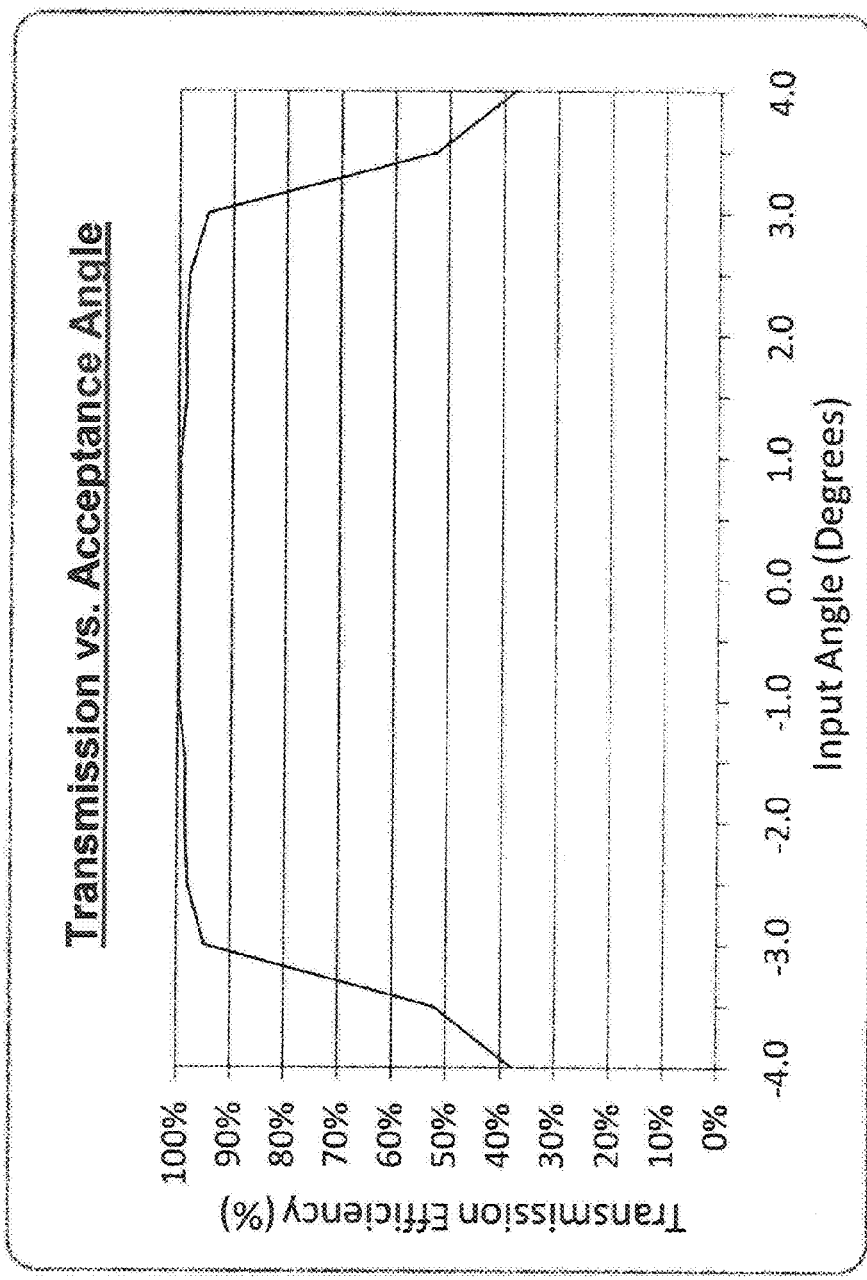
FIG. 17 illustrates light transmission versus acceptance angle for a system like FIG. 13.

FIG. 17 shows transmission as a function of input half angle $\theta_1$ through the embodiment of the invention shown in FIG. 13. The calculation is based on ray tracing software. The embodiment was designed to function within input angles of +−3 degrees. The efficiency takes into account losses from Fresnel reflections and hard reflections. As is shown, the efficiency of the device approaches 100% at $\theta_1$=0 degrees, stays near 100% within +−3 degrees, and then drops off sharply.

Figure 2:
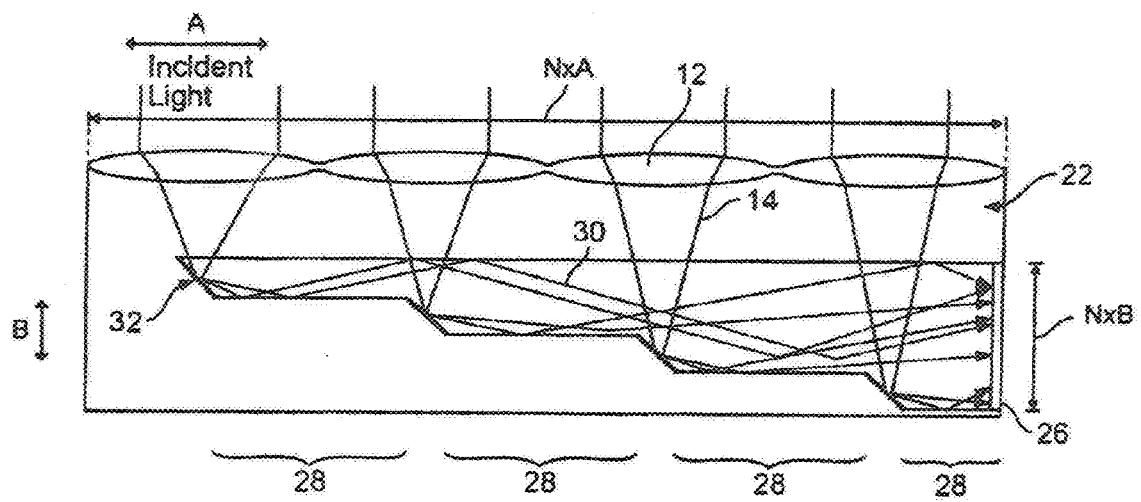
FIG. 2 illustrates a cross-sectional view of one embodiment of a light waveguide shown schematically in FIG. 1.

In another preferred form of the concentrator system 10 shown in FIG. 2, the incident light 14 is concentrated or focused in a first step using the element 12 described hereinbefore. The concentrated light 20 is further processed by associating sections of the concentrator system 10 with reflector/waveguide sections 28. Each of the reflector/waveguide sections 28 comprises a reflective section 32 which receives the concentrated light 20 and redirects light 30 within the associated waveguide section 28 with the light 30 undergoing total internal reflection (TIR) along the length of the entire waveguide 22. A plurality of the reflector/waveguide sections 28 comprise the waveguide 22 and forms a stepped form of waveguide construction.

Figure 18:
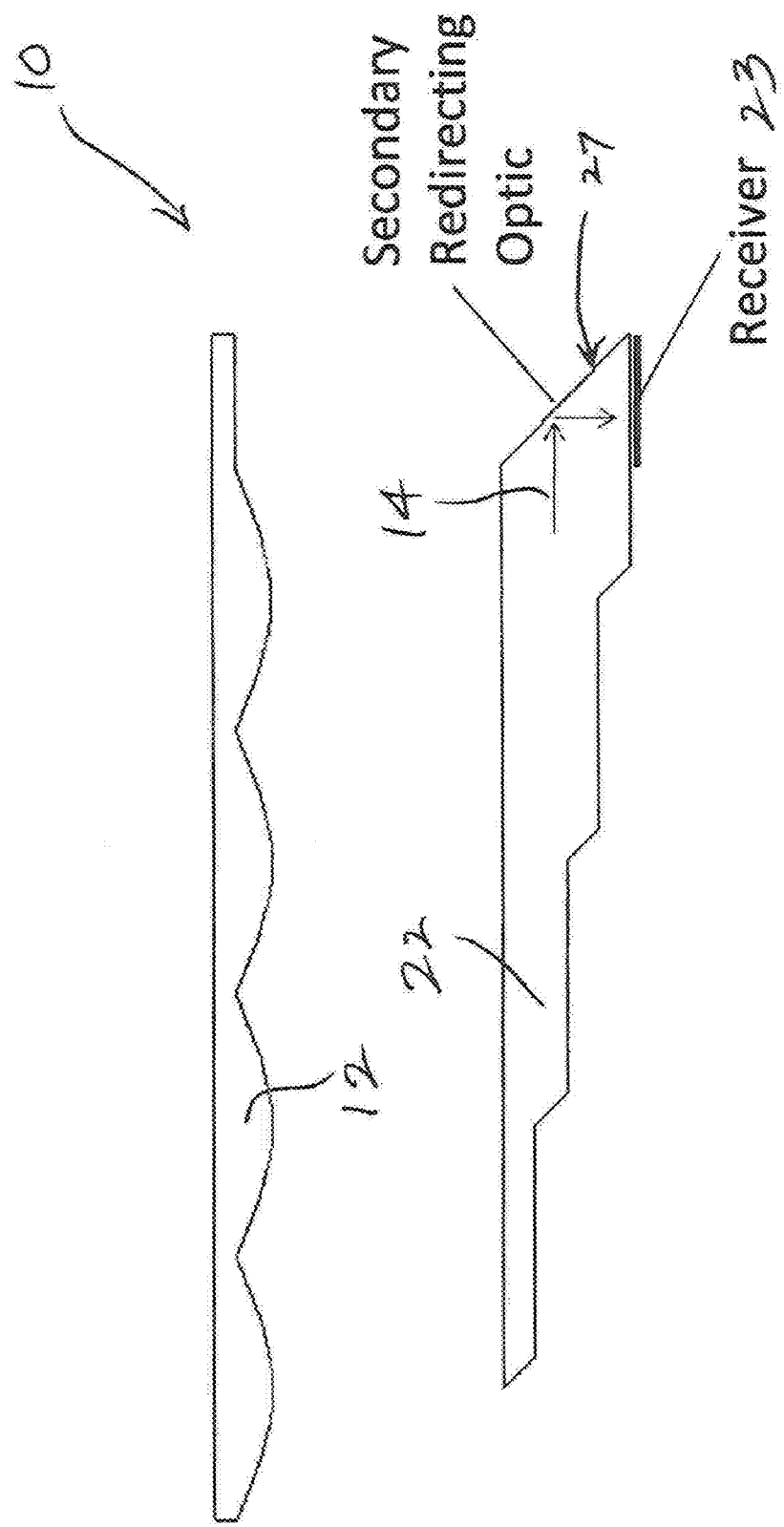
FIG. 18 illustrates an embodiment where the waveguide ends with a reflector component for redirecting light towards a base surface.

FIG. 18 shows another embodiment of the system 10 where the waveguide 22 ends in a reflector 27 that redirects the light 14 towards the base surface of the waveguide 22, where the receiver 23 may be placed. It can be of manufacturing benefit to have the concentrator optics be laid down flat onto a plane of conventional receiver elements which embody the receiver 23.

Figure 19:
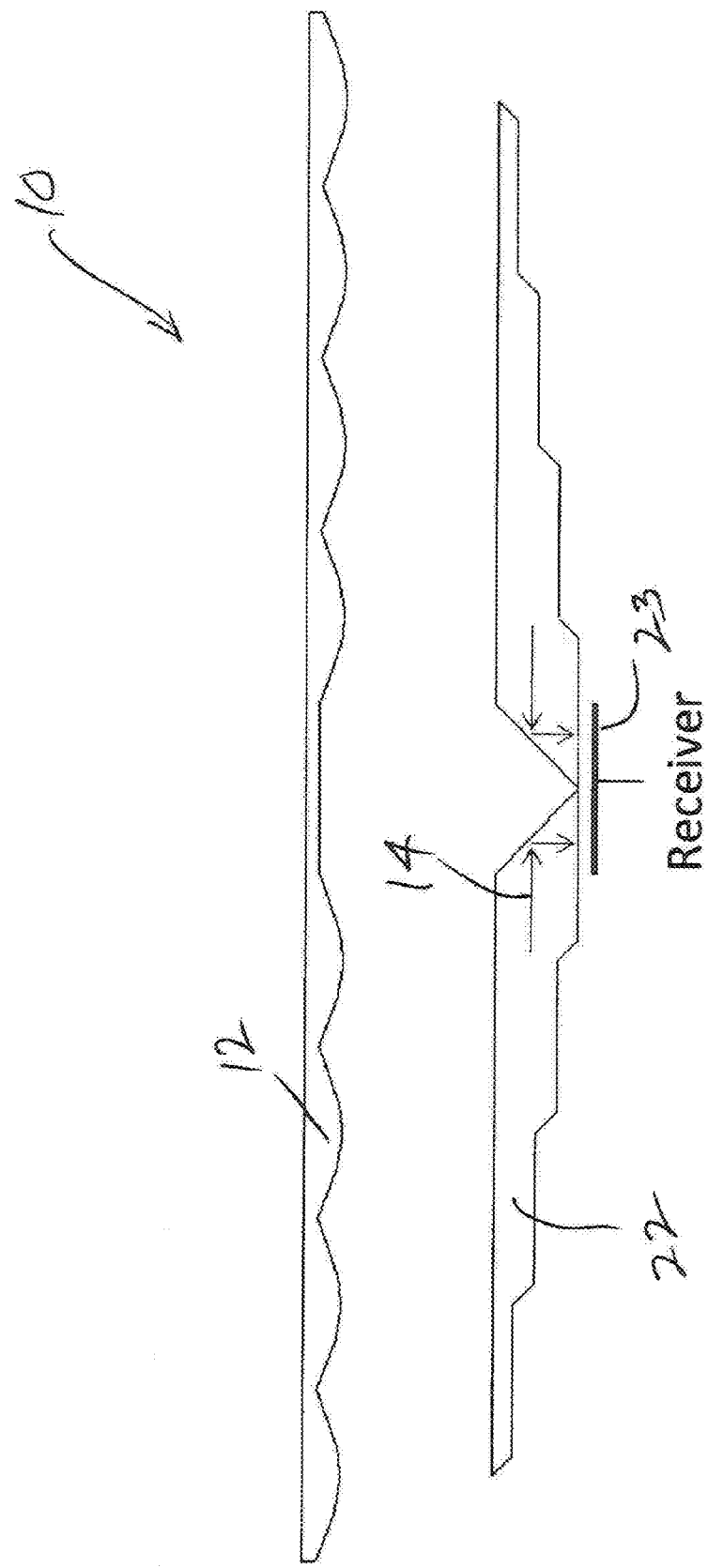
FIG. 19 illustrates a variation on FIG. 18 where the concentrator is mirrored about an axis of symmetry.

With this construction, the concentrator 12 can be mirrored about an axis of symmetry as shown in FIG. 19, such that the two receivers 23 from either end form one contiguous area where one single receiver 23 may be placed. In this case, since the aperture area is doubled but the thickness of the concentrator 12 unchanged, the limit of compactness is given by 1/(2×Concentration Ratio).

Figure 20:
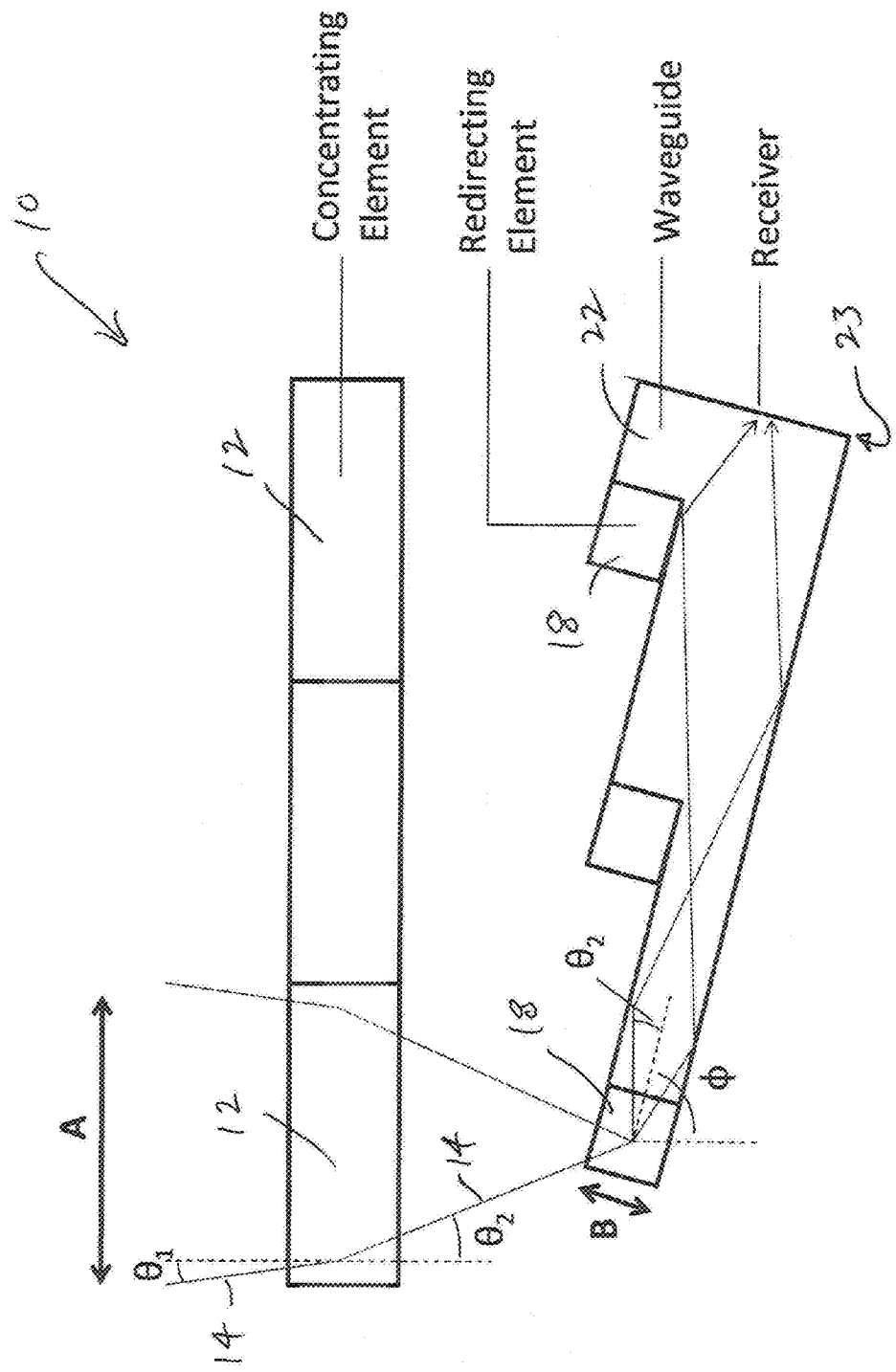
FIG. 20 illustrates a form of the embodiment of FIG. 13 with the waveguide and redirecting elements tilted relative to the concentrators.

The redirecting element 18 rotates the light paths by an angle $\phi$. In FIG. 13, $\phi$ is shown to be 90 degrees. FIG. 20 depicts $\phi$<90 degrees. This can allow, as one benefit, the concentrating elements 12 to be located on the same plane, and the redirecting elements 18 on their own plane as well, which can aid manufacturability.

Figure 21:
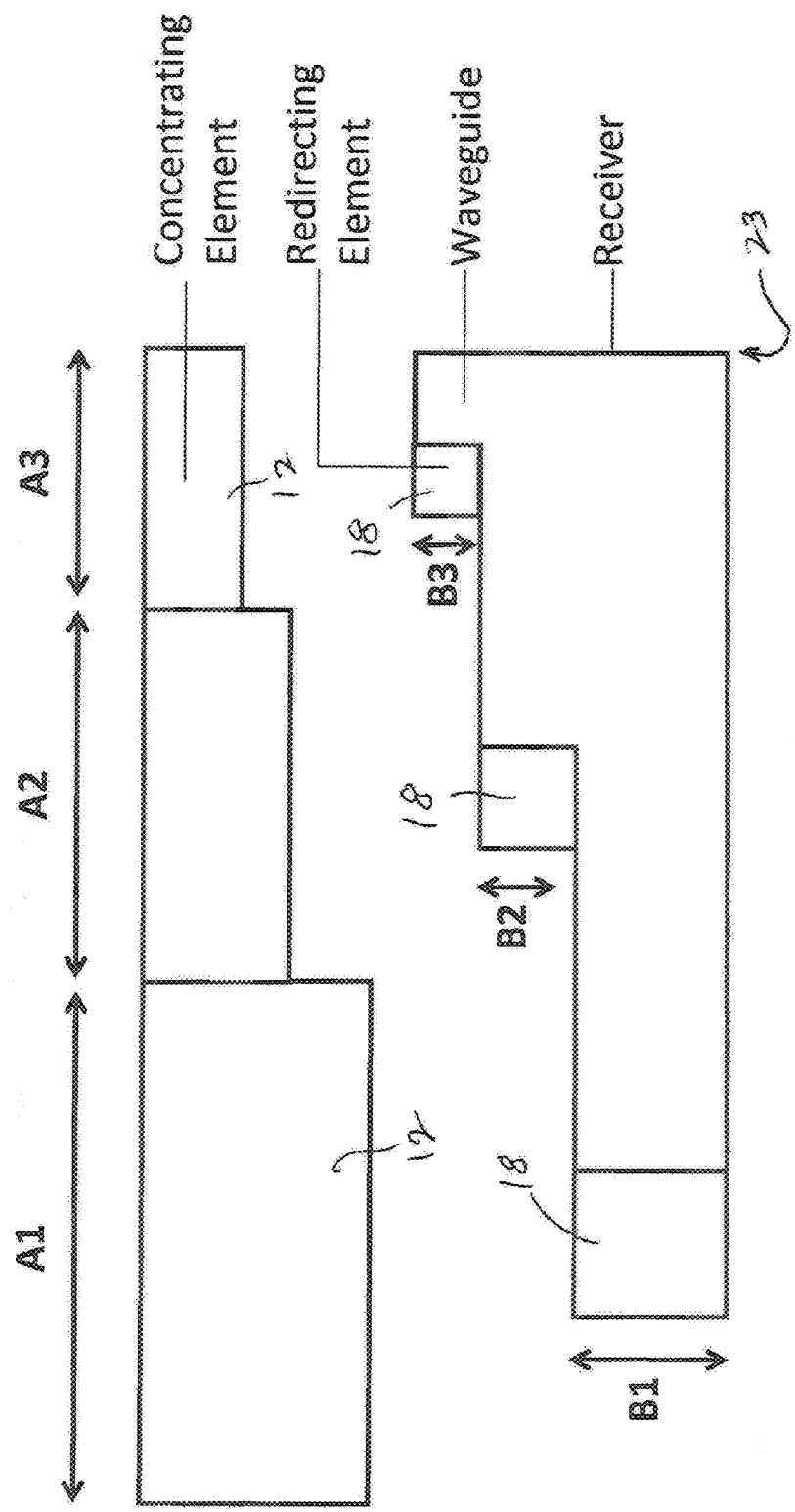
FIG. 21 illustrates an embodiment with varying size of concentrator and/or redirecting element.

The concentrating element 12 and the redirecting element 18, and associated waveguides 22, may also vary in size and FIG. 21 shows an example of this. Here A1, A2, and A3 are different lengths, as are B1, B2 and B3. However, the Concentration Ratio stays the same in each section: A1/B1=A2/B2, and so on. The aspect ratio of the waveguide 22 is therefore still given by $$= (B1 + B2 + B3)/(A1 + A2 + A3)$$

$$= 1/\text{Concentration Ratio}$$

Figure 22:
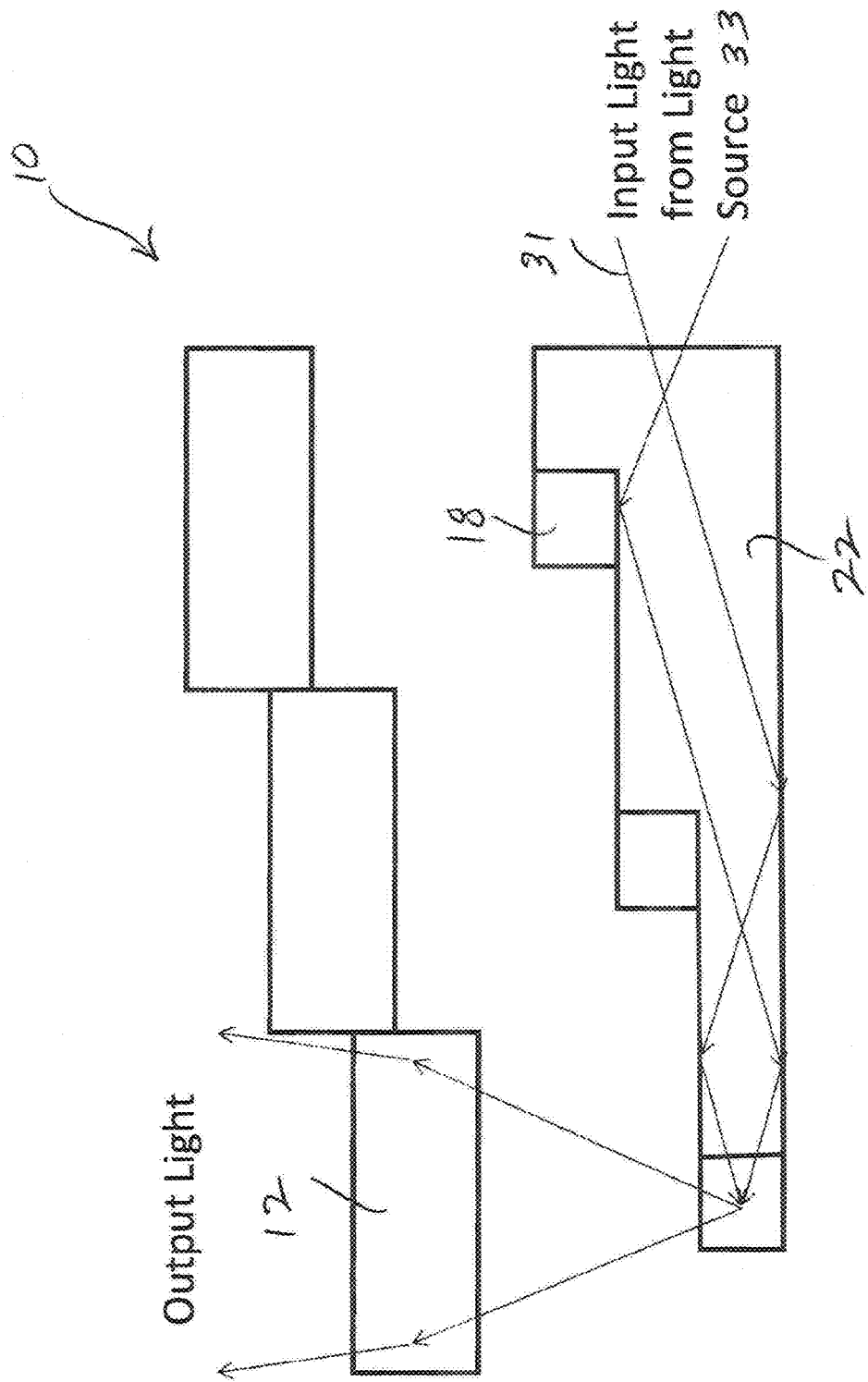
FIG. 22 illustrates an embodiment for light diffusion using a light source in place of a receiver.

In another embodiment shown in FIG. 22, the system 10 can also be utilized as a light diffuser by running light 31 through it in reverse. In FIG. 22, light input from a light source 33 that was originally the receiver 23, is channeled through the waveguide 22, redirected by the redirecting element 18 onto the concentrating element 12, which delivers the output light above the system 10. Applications include illumination, backlighting, and other light diffusing devices. It should be understood throughout that optics illustrated for concentration of light can also be used for illumination with the "receiver 23" being replaced by a light source.

Figure 3:
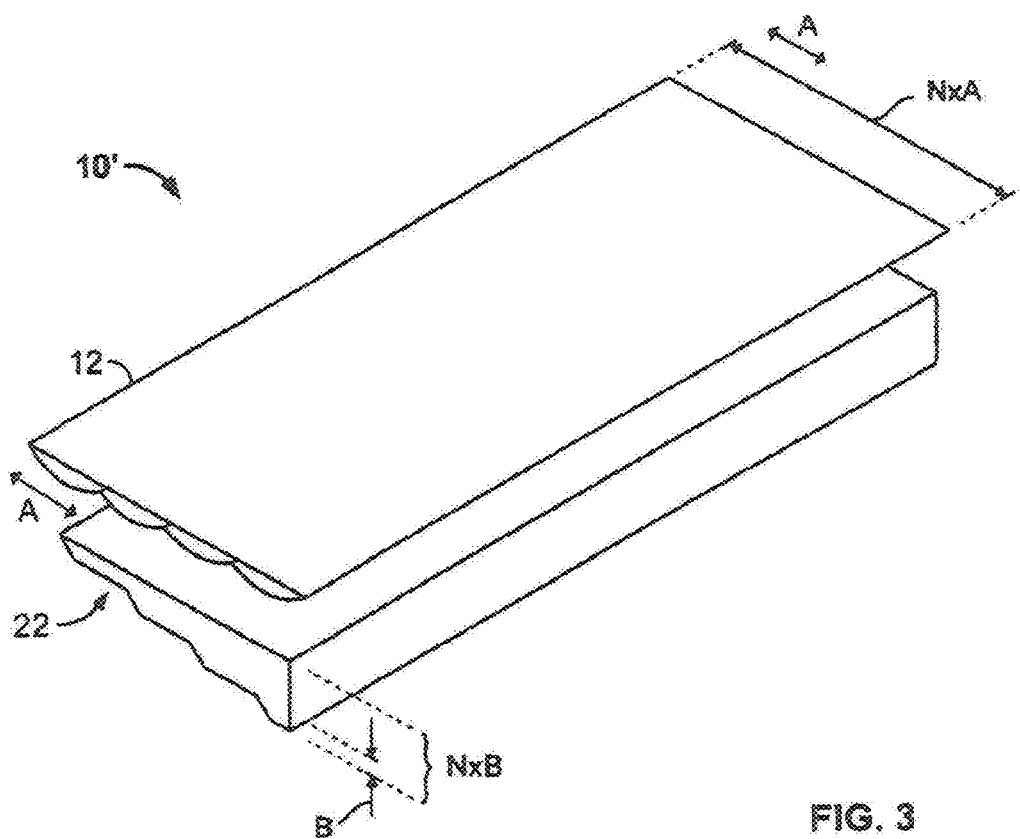
FIG. 3 illustrates another cross-sectional view of a linear embodiment of a light waveguide shown schematically in FIG. 1.

The cross-section of the various reflector/waveguide sections 28 provides a basic building block for various configurations of the concentrator system 10. One exemplary commercial embodiment is shown in FIG. 3 with an aspect ratio N×B/N×A, A/B, an area concentration factor or energy density $\Delta\emptyset$ which is proportional to A/B where N×A is the length of the waveguide 22 and N×B is the largest thickness (see FIGS. 2 and 3). In a most preferred embodiment, the thickness N×B is comprised of a plurality of incremental step heights, B, which provide a clear light pathway for TIR light from each of the reflector/waveguide sections 32.

Figure 4:
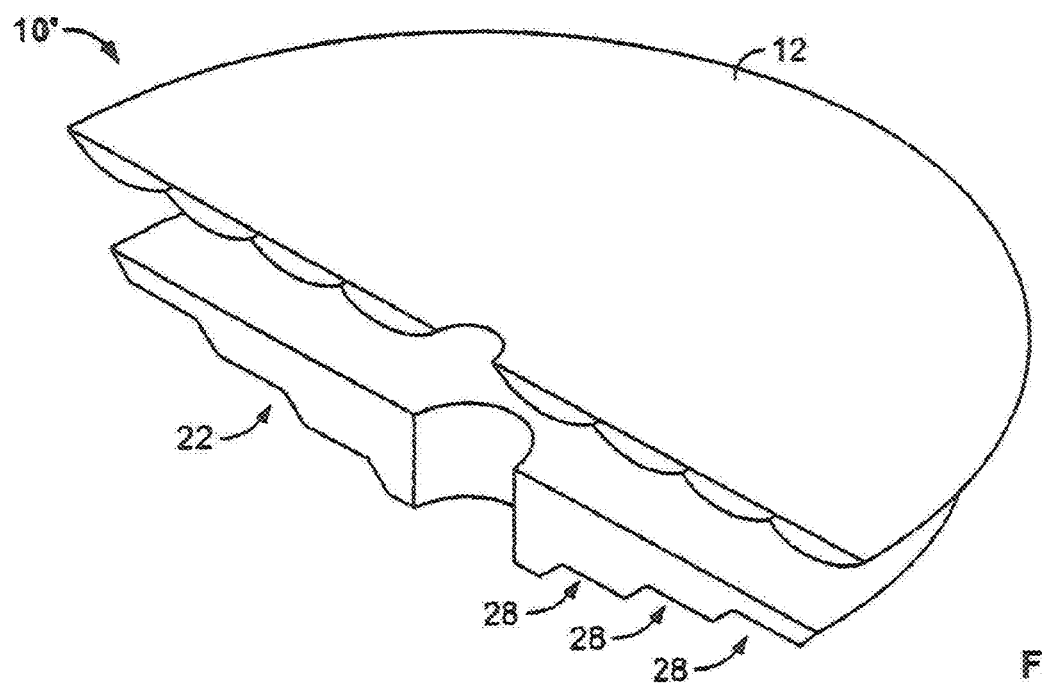
FIG. 4 illustrates another cross-sectional view of a rotational embodiment of a light waveguide shown schematically in FIG. 1.

FIG. 4 illustrates another example of the concentrator system 10 in the form of a rotationally (or axially) symmetric geometry having a concentrator system 10' and the concentrating element 12 in association with the reflector/waveguide sections 28 of the waveguide 22. This rotationally symmetric form of the concentrator system 10' (or the system 10), which can be any portion of a full circle, enables three dimensional radial convergence of the incident light 14 resulting in $\Delta\emptyset$ the Concentration Ratio being proportional to $(A/B)^2$ thereby substantially enhancing collection and concentrator efficiency. In a most preferred embodiment of FIG. 4 two axis solar tracking is used as opposed to the single axis tracking for the embodiment of FIG. 3.

Figure 23:
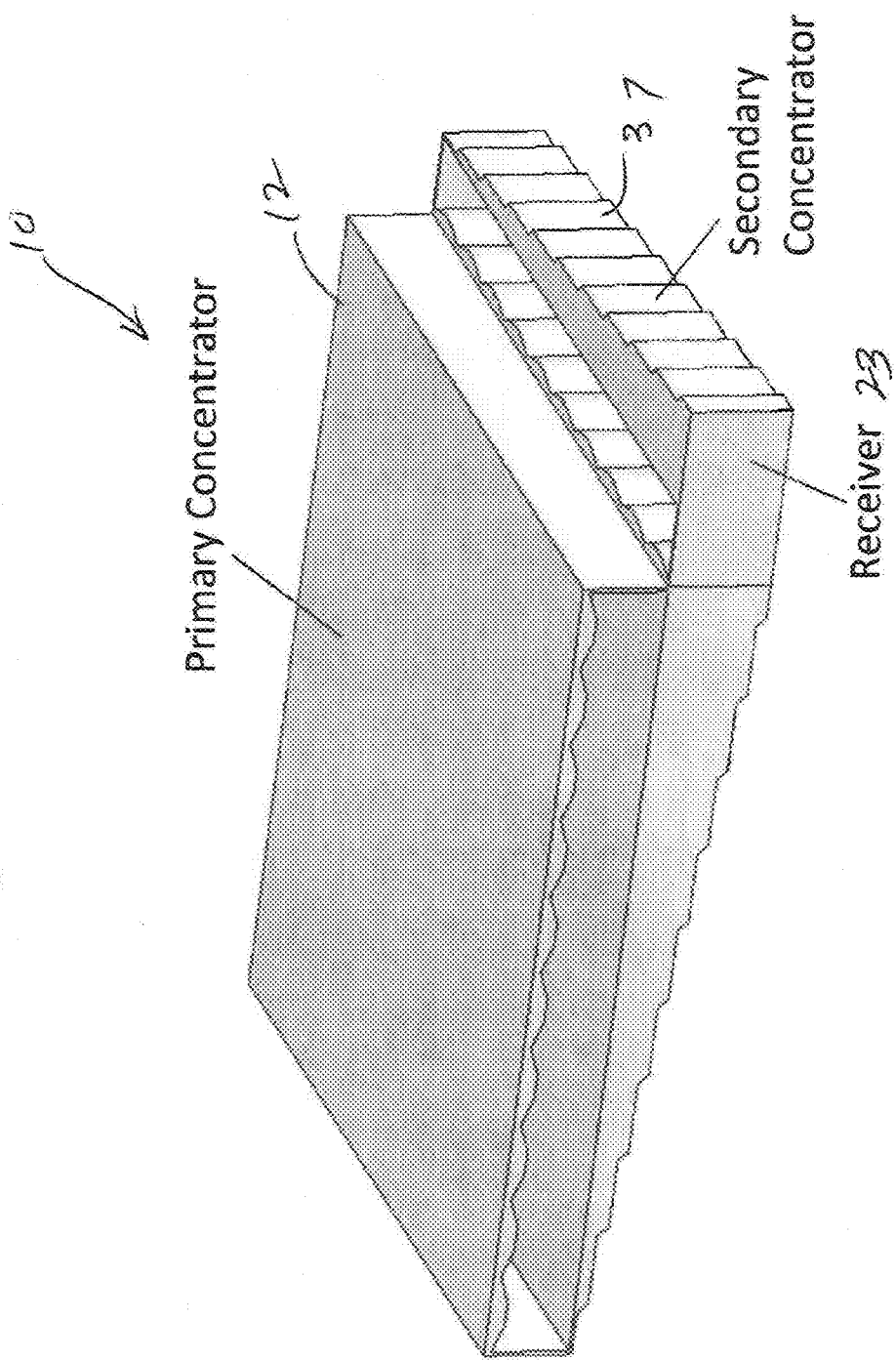
FIG. 23 illustrates a different variation on the embodiment of FIG. 4 to achieve light concentration across two axes.

FIG. 4 shows one way to achieve concentration across two axes, and FIG. 23 shows another way. Here, a linearly symmetric primary concentrator 12 delivers light concentrated along one axis to its receiver 23 at the side of a concentrator 12. There, a second linearly symmetric concentrator 37 is positioned in the perpendicular axis. This secondary concentrator 37 concentrates light along the second axis, bringing the light to the final receiver 23.

Figure 24:
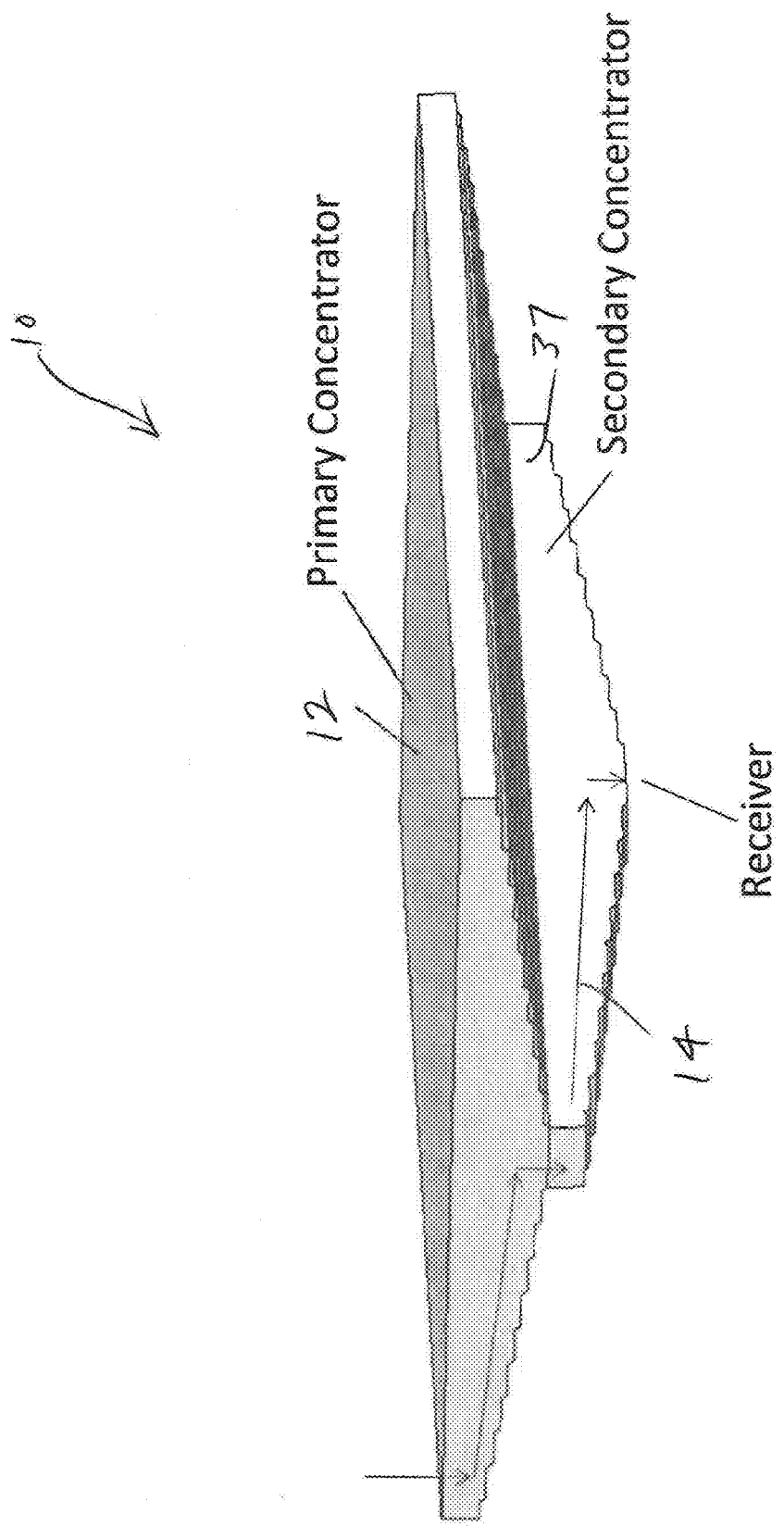
FIG. 24 illustrates yet another embodiment to achieve concentration across two axes.

FIG. 24 shows a third way to achieve concentration across two axes. Here the concentrators 12 shown are of the mirror symmetry as described in FIG. 19. Again, a linearly symmetric primary concentrator 12 delivers light 14 concentrated along one axis to its receiver 23 at the base of the concentrator 12. There, a second linearly symmetric concentrator 37 is positioned in the perpendicular axis. This secondary concentrator 37 concentrates the light 14 along the second axis, bringing the light to the final receiver 23.

In addition to the linear and rotational embodiments of FIGS. 3 and 4, the concentrator system 10' can be disposed both above and/or below the waveguide 22 relative to the direction of the incident light 14. In such embodiments, some of the light 14 will pass through the waveguide 22 and be redirected back to the waveguide 22 by the concentrator system 10'. These forms of systems enable light recycling and thus improve end efficiency and the use of the reflective systems for concentration, described herein, show an increased efficiency for concentration of light relative to conventional refractive system.

In other embodiments, the reflective elements 18 can be angularly adjusted with respect to the waveguide 22 in order to cause TIR. The reflective element 18 can be an integral part of the waveguide 22 with a variety of angular profiles (see FIGS. 5A and 5B). The element 18 also can be separate elements 38 and 39 (see FIGS. 5C and 5D). In addition, the reflective element 18 and the associated waveguide 22 can also take the form of complex light collector pipes 42 and light redirecting components 43 as shown in FIGS. 5E and 5F, respectively.

The above described forms of the concentrator system 10 and 10' provide concentrated light 20 to a contiguous area as opposed to a nodal area, thereby allowing delivery of concentrated solar energy to a variety of downstream receivers 26, such as a solar cell, a light pipe for further processing, a heat exchanger, a secondary concentrator and a light spectrum splitter.

Figure 7:
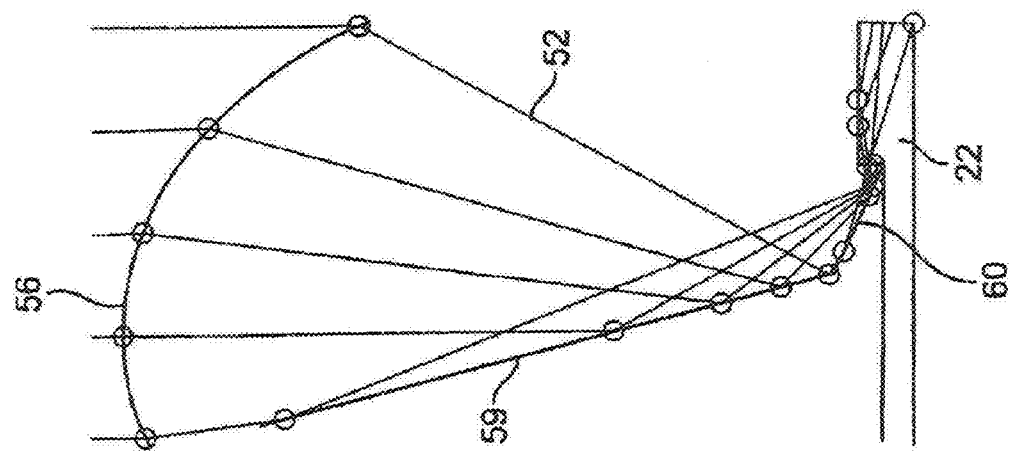
FIG. 7 shows a curved concentrating element and two planar reflectors coupled to a waveguide.
Figure 6:
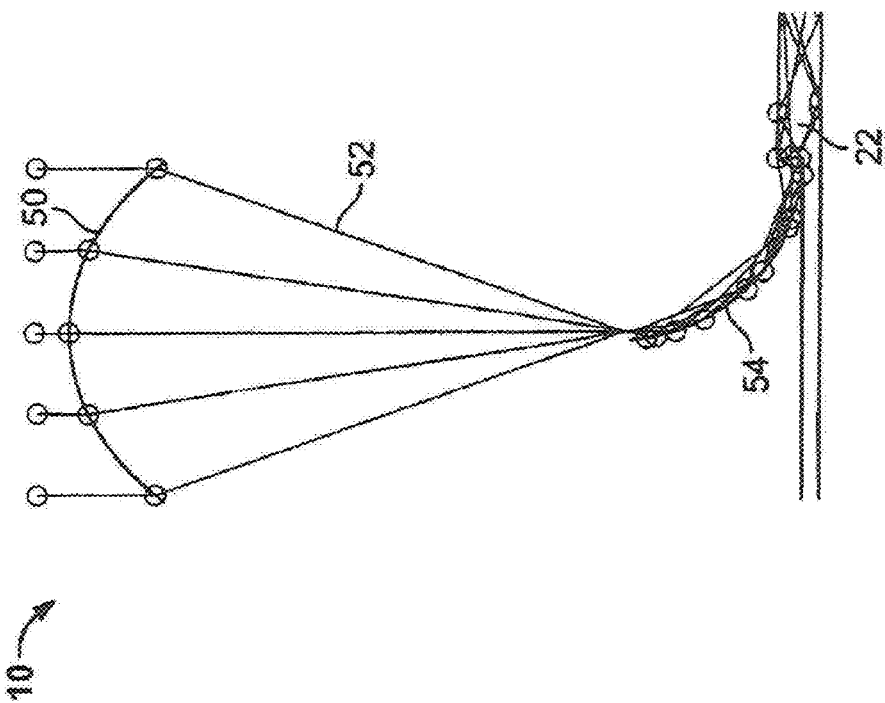
FIG. 6 shows a curved concentrating element and curved reflector coupled to a waveguide.

In yet another series of embodiments shown in FIGS. 6-11B, a variety of optical components can be used in combination to further and substantially enhance both the concentration and-collection efficiency. FIG. 6 in a most preferred embodiment shows a curved concentrating element 50 directing light 52 onto a curved reflector 54 which passes the light 52 into the waveguide 22. FIG. 7 in another most preferred embodiment shows another curved concentrating element 56 which directs the light 52 off a reflector 58 having two planar surfaces 59 and 60 which redirect the light 52 by TIR into the waveguide 22. FIG. 8A shows a partially closed optical element 64 which redirects the light 52 at interface 66, reflects the light 52 off curved reflector 68 focusing the light 52 onto interface 70 between a bottom reflective surface 72 of the optical element 64. As best seen in the enlarged view of FIG. 8B, the waveguide 22 has a substantially complementary angular match to the reflective surface 72.

Figure 8A:
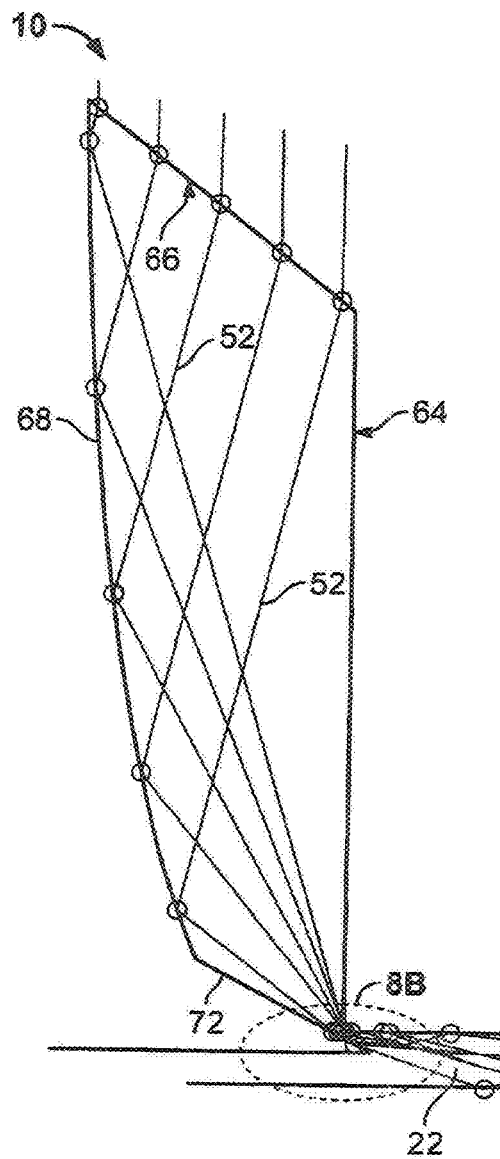
FIG. 8A shows a closed optical element coupled to a waveguide and FIG. 8B shows an enlarged view of a portion of FIG. 8A at the juncture of the optical element and waveguide.
Figure 8B:
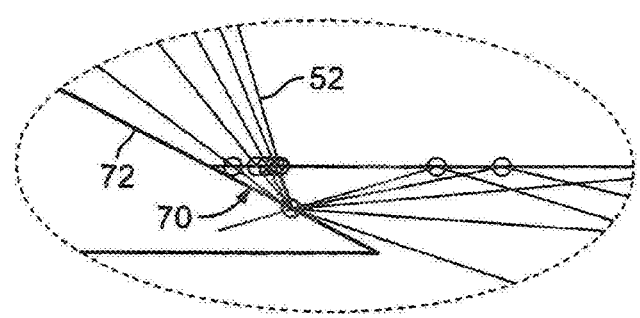
Figure 9A:
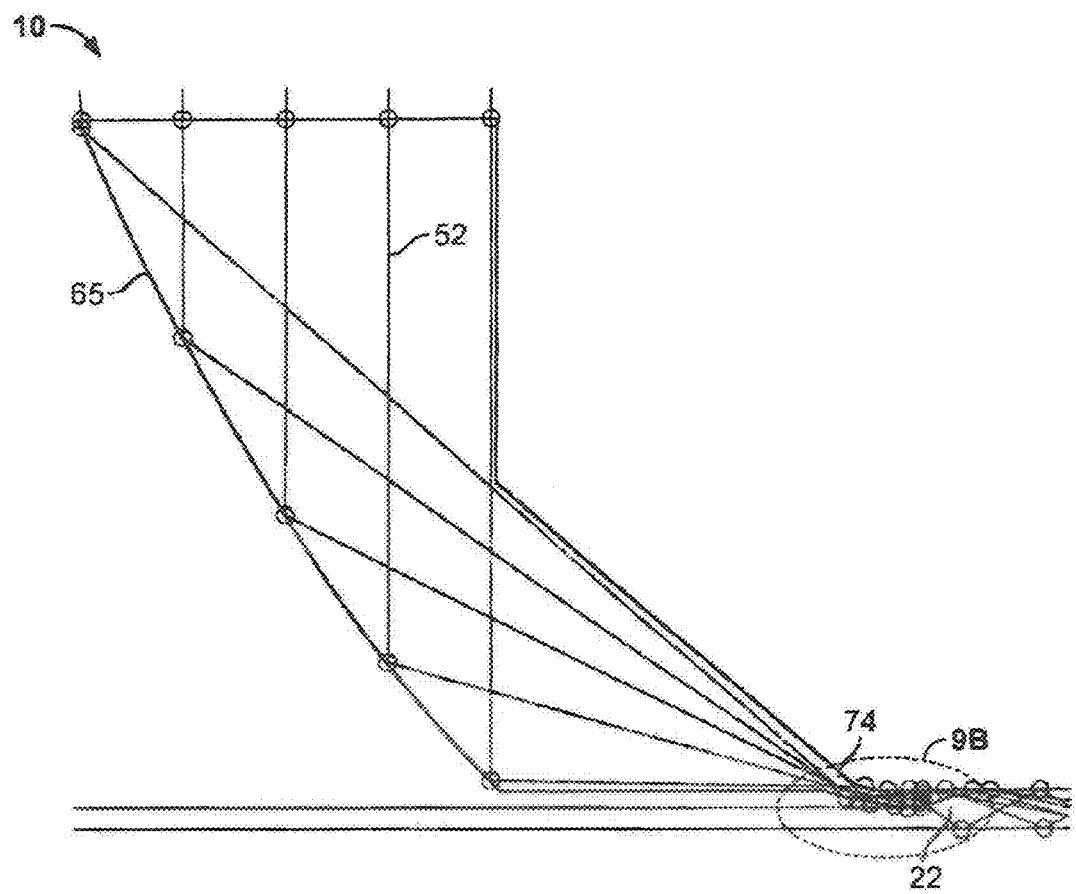
FIG. 9A shows another closed optical element coupled to a waveguide and FIG. 9B shows an enlarged view of a portion of FIG. 9A at the juncture of the optical element and the waveguide.
Figure 9B:
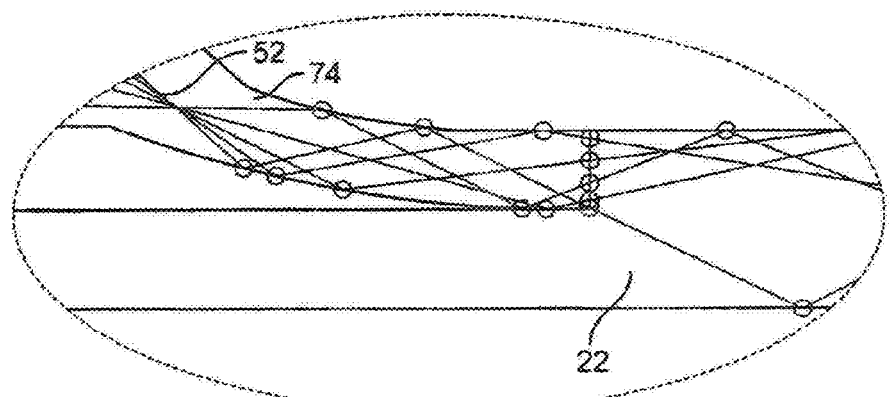

In FIG. 9A in another most preferred embodiment is a similar system as in FIG. 8A, but the optical element 65 is closed and coupled to an extension waveguide 74 (a form of light pipe) which collects the light 52 and transmits it into the waveguide 22 (as best seen in FIG. 9B).

Figure 10A:
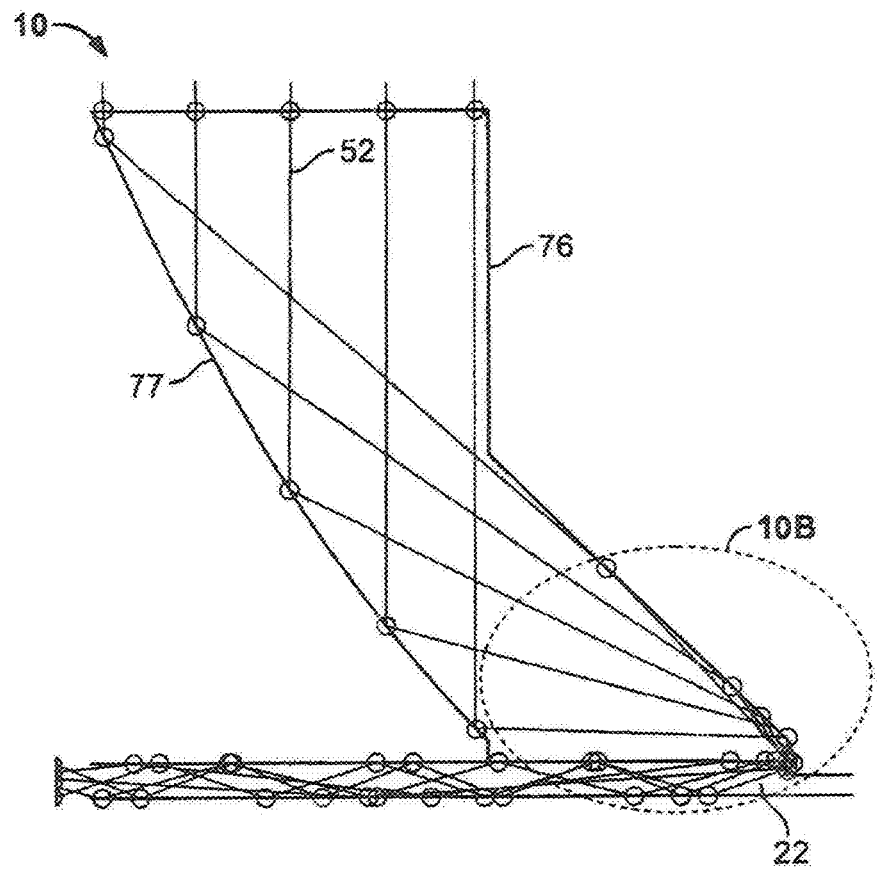
FIG. 10A shows another closed optical element coupled to a waveguide and FIG. 10B shows an enlarged view of a portion of FIG. 10A at a juncture of the optical element and the waveguide.
Figure 10B:
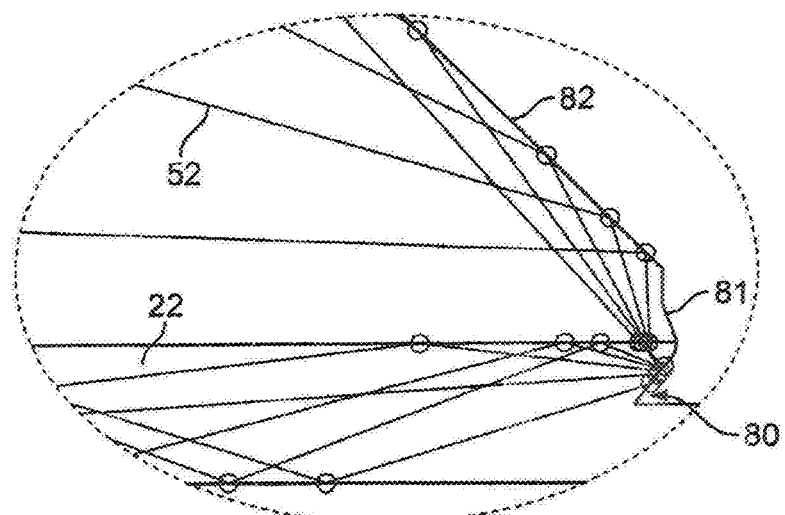

In FIG. 10A an optical element 76 is closed with the input light 52 reflected by TIR from reflective surface 77 with a particular angular cross section best shown in FIG. 10B which enables collection of the light from TIR and coupling with the waveguide 22 from reflection off surfaces 80, 81 and 82.

In FIG. 11A an optical element 82 cooperates with another reflector 84 to direct the light 52 into the waveguide 22 from the two different optical sources 82 and 84, thereby further ensuring collection of all the light incident on surface 86 of the optical element 82. In this embodiment the optical elements 82 and 84 perform the role of both concentrating elements and reflecting elements.

Figure 25:
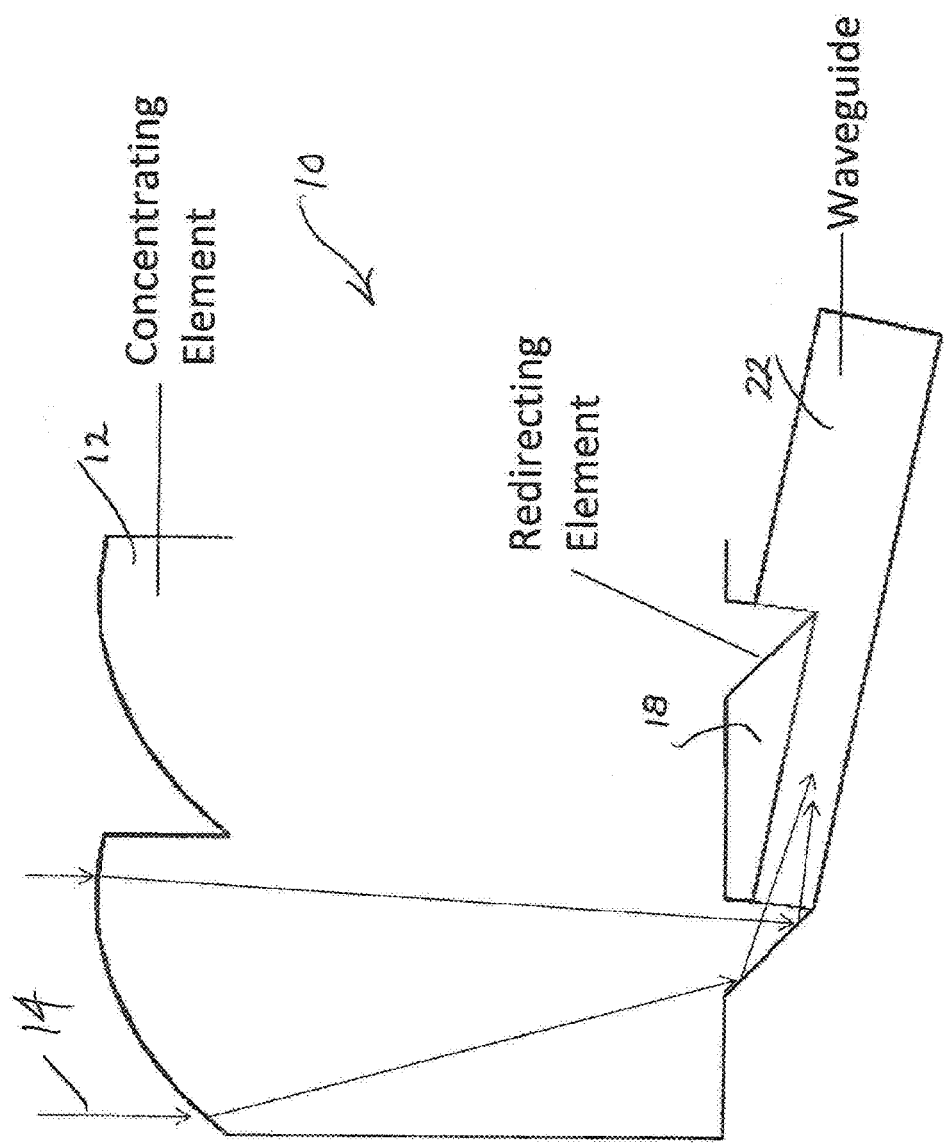
FIG. 25 illustrates a different embodiment of a solar concentrator of the invention.

In FIG. 25, a curved concentrating element 12 directs the light 14 onto (the redirecting component 18) which passes the light 14 into the waveguide 22. The concentrating element 12 and the redirecting component 18 are shown as two different features on the same physical part, while the waveguide 22 is shown as a second physical part coupled to the first. In FIG. 26, a curved concentrating element 12 directs the light 14 onto two reflectors (the redirecting component 18) acting in sequence which pass the light 14 into the waveguide 22. The concentrating element 12, the redirecting component 18, and waveguide 22 are all shown as separate physical parts coupled together. FIG. 27 directs the light 14 into the waveguide 22 similar to FIG. 26. However, the redirecting component 18 and the waveguide 22 are combined into one construction.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A solar concentrator, comprising:
    a plurality of optical elements disposed adjacent each other with each of the plurality of optical elements including:
    (a) a concentrator element for collecting and repositioning input light; and
    (b) an associated redirecting element which is associated with and separate from the concentrator element for receiving the light from the concentrator element wherein the concentrating element of each of the plurality of optical elements is separated from at least one portion of the associated redirecting element by a layer within which the light does not undergo a repositioning change of direction and the layer being contiguous between at least one portion of each of the associated redirecting elements; and the solar concentrator further including:
    a stepped waveguide for receiving the light from the at least one portion of the associated redirecting element which is constructed to reposition the light into the stepped waveguide for accumulation; and
    (c) a light receiver for receiving the light from the stepped waveguide.

2. The solar concentrator as defined in claim 1 wherein an end of the waveguide has an additional optical feature that redirects the light from the waveguide towards the receiver.

3. The solar concentrator as defined in claim 1 where the plurality of optical elements and the stepped waveguide are mirrored about a central axis to form at least two systems, such that the receivers from the at least two systems combine to form one contiguous receiver, and the solar concentrator comprises an increased width of at least about twice that of one system while retaining a same height.

4. The solar concentrator as defined in claim 1 wherein the concentrating elements and redirecting elements have a size selected from the group of about the same size and varying size.

5. The solar concentrator as defined in claim 1 further including a light receiver and wherein the receiver is replaced with a light source, thereby enabling the solar concentrator to operate in reverse as a light diffuser.

6. The solar concentrator as defined in claim 1 where the solar concentrator is linearly symmetric and delivers light concentrated along one axis to the end of the waveguide, at which point a second solar concentrator is located in a second axis, collecting light from the first concentrator and concentrating light along the second axis.

7. The solar concentrator as defined in claim 1 where the solar concentrator includes a first solar collector which is linearly symmetric and delivers light concentrated along one axis to the receiver at which point a second solar concentrator is located in a second axis, collecting light from the first solar concentrator and concentrating light along the second axis, thereby outputting the light thus concentrated in two axes to the receiver.

8. The solar concentrator as defined in claim 1 wherein the stepped waveguide has upper and lower horizontal surfaces which are substantially parallel to the top collecting surface of the solar concentrator.

9. The solar concentrator as defined in claim 1 wherein the stepped waveguide has upper and lower horizontal surfaces which are disposed at an angle to the top collecting surface of the solar concentrator.

10. An optical system for processing light from a light source to provide illumination output, comprising:
   a stepped waveguide for collecting input light from a light source and delivering light to step features of the stepped waveguide.;
   a plurality of optical elements disposed adjacent each other with each of the plurality of optical elements including:
   (a) a redirecting element for receiving the light from the waveguide and repositioning the light; and
   (b) an associated concentrator element which is associated with and separate from the redirecting element for receiving the light from the redirecting element and diffusing the light for output therefrom to provide the illumination, wherein the concentrating element of each of the plurality of optical elements is separated from at least one portion of the associated redirecting element by a layer within which the light does not undergo a repositioning change of direction and the layer being contiguous between at least a portion of each of the associated redirecting elements.

11. In an optical system for processing light from a light source with light flow from a collection component and output to provide an illumination, the improvement comprising:
   a collection component including a stepped waveguide for collecting input light from a light source and delivering light to step features of the stepped waveguide;
   a plurality of optical elements disposed adjacent each other with each of the plurality of optical elements including:
   (a) a redirecting element for receiving the light from the waveguide and repositioning the light; and
   (b) an associated concentrator element which is associated with and separate from the redirecting element for receiving the light from the redirecting element and diffusing the light for output therefrom, to provide the illumination, wherein the concentrating element of each of the plurality of optical elements is separated from at least one portion of the associated redirecting element by a layer within which the light does not undergo a repositioning change of direction and the layer being contiguous between at least a portion of each of the associated redirecting elements.

* * * * *